United States Patent
Zehe

(10) Patent No.: US 6,348,699 B1
(45) Date of Patent: Feb. 19, 2002

(54) JOSEPHSON JUNCTION ARRAY DEVICE, AND MANUFACTURE THEREOF

(75) Inventor: Alfred Zehe, Puebla (MX)

(73) Assignee: Oxxel Oxide Electronics Technology GmbH, Bremen (DE)

( * ) Notice: Subject to any disclaimer, the term of this patent is extended or adjusted under 35 U.S.C. 154(b) by 0 days.

(21) Appl. No.: 09/230,413
(22) PCT Filed: Jul. 19, 1997
(86) PCT No.: PCT/EP97/03891
  § 371 Date: May 19, 1999
  § 102(e) Date: May 19, 1999
(87) PCT Pub. No.: WO98/04003
  PCT Pub. Date: Jan. 29, 1998

(30) Foreign Application Priority Data

Jul. 23, 1996 (EP) .............................. 96111820

(51) Int. Cl.⁷ ...................... H01L 29/06; H01L 31/0256
(52) U.S. Cl. .............................. 257/32; 257/31; 257/33; 505/190; 505/234
(58) Field of Search ...................... 257/30–33; 505/190, 505/234

(56) References Cited

U.S. PATENT DOCUMENTS

| | | | | |
|---|---|---|---|---|
| 3,643,237 A | * | 2/1972 | Anacker ..................... | 365/160 |
| 3,725,213 A | | 4/1973 | Pierce | |
| 4,837,604 A | | 6/1989 | Faris ........................... | 257/36 |
| 5,109,164 A | | 4/1992 | Matsui | |
| 5,114,912 A | | 5/1992 | Benz | |
| 5,346,882 A | | 9/1994 | Muller ....................... | 505/190 |
| 5,399,881 A | * | 3/1995 | Bozovic et al. ............. | 505/190 |
| 5,721,196 A | * | 2/1998 | Nakamura et al. .......... | 505/237 |

FOREIGN PATENT DOCUMENTS

| | | |
|---|---|---|
| DE | 41 37 953 A1 | 5/1993 |
| DE | WO-98/04002 A1 * | 1/1998 |
| EP | 0 382 609 A2 | 8/1990 |
| EP | 0 466 145 A2 | 11/1991 |
| EP | 0 466 146 B1 | 11/1991 |
| EP | 0 513 557 B1 | 8/1998 |
| JP | 5-291632 | 11/1993 |
| JP | 8-162681 | 6/1996 |
| WO | WO 92/22426 | 12/1992 |

OTHER PUBLICATIONS

Lukens, James. "Josephson Arrays as High Frequency Sources" Chapter 4, pp. 135–167 (1990).*

Konopka, J. et al. "Emission Properties of Step–Edge Josephson Junction Series Arrays" pp. 233–238 (1994).*

Kunkel, G. & Siegel, M. "Investigations of Josephson Arrays as a Source on Coherent Radiation" pp. 128–139 (1994).*

(List continued on next page.)

Primary Examiner—Allan R. Wilson
(74) Attorney, Agent, or Firm—Merchant & Gould P.C.

(57) ABSTRACT

A superconductive device is disclosed, which has specific characteristics of a generator and/or detector of sub-millimeter wave length radiation, comprising a two-dimensional lateral array of mesas (column-shaped elements) each containing vertically stacked Josephson junctions on top of one another. This device is capable of covering the entire frequency range between the microwave and far infrared spectral regions, in plurality of applications, where radiation emission and detection is involved. According to its various embodiments, thin columns (stacks) of Josephson junctions are monolithically built between superconducting electrical top and bottom contact layers. Mutually isolated segments cut out of the contact layers allow for optimization of circuit parameters such as impedance matching to load and maximizing the output power. External electronic control allows modulation of the radiation field and other operation modes of the device. The specification also describes special applications of the disclosed device.

8 Claims, 12 Drawing Sheets

OTHER PUBLICATIONS

Konopka, J. "Josephson Millimeter and Submillimeter Wave Sources" pp. 221–232 (1994).*

Nakamura, O. et al., "Synthesis and properties of α–axis and β–axis oriented $GdBa_2Cu_3O_7$–δ high $T_c$ thin films", *Appl. Phys. Lett.*, vol. 61, No. 21, pp. 2598–2600 (Nov. 23, 1992).

Richards, P. et al., "Superconducting Components for Infrared and Millimeter–Wave Receivers", *Proceedings of the IEEE*, vol. 77, No. 8, pp. 1233–1246 (Aug. 1989).

Wendt, J. et al., "$YBa_2Cu_3O_7$ Nanobridges Fabricated by Direct–Write Electron Beam Lithography", *Appl. Phys. Lett.*, vol. 61, No. 13, pp. 1597–1599 (Sep. 28, 1992).

Kleiner, R. et al., "Dynamic Behavior of Josephson–Coupled Layered Structures" *Physical Review B (Condensed Matter)*, Aug. 1, 1994, USA. vol. 50, No. 6, pp. 3942–3952.

Jain, A.K. et al. "Mutual Phase–Locking in Josephson Junction Arrays" *Physics Reports (Review Section of Physics Letters) 109*, No. 6 (1984), pp. 309–426. No month given.

Hansen, J. Bindslev & Lindelof, P.E. "Static and Dynamic Interactions Between Josephson Junctions" *Review of Modern Physics*, vol. 56, No. 3, Jul. 1984, pp. 431–459.

Wiesenfeld, K. Et al. "Phase–Locked Oscillator Optimizing for Arrays of Josephson Junctions" *J. Appl. Phys. 76 (6)*, Sep. 15, 1994, pp. 3835–3846.

Han, Siyuan et al. "Demonstration of Josephson Effect Submillimeter Wave Sources With Increased Power" *Appl. Phys. Lett.*, 64 (11), Mar. 14, 1994, pp. 1424–1426.

Booi, P.A.A. & Benz, S.P. "Emission Linewidth Measurements of Two–Dimensional Array Josephson Oscillators" *Appl. Phys. Lett.*, 64 (16), Apr. 18, 1994, pp. 2163–2165.

Bozovic, Ivan et al. "Superconducting Oxide Multilayers and Superlattices: Physics, Chemistry, and Nanoengineering" *Physica C*, 235–240 (1994), pp. 178–181. No month given.

Kleiner, R. et al. "Intrinsic Josephson Effects in $Bi_2Sr_2CaCu_2O_8$ Single Crystals" *Physical Review Letters*, vol. 68, No. 15, Apr. 13, 1992, pp. 2394–2397.

Kleiner, R. et al. "Intrinsic Josephson Effects in High–$T_c$ Superconductors" *Physical Review B*, vol. 49, No. 2, Jan. 1, 1994–II, pp. 1327–1341.

Müller, Paul. "Intrinsic Josephson Effects in Layered Superconductors" *Andvances in Solid State Physics*, vol. 34 (Aug. 1994), pp. 1–66.

Müller, Paul. "Layered Superconductors as One–Dimensional Josephson Arrays" to appear in *Oxide Superconductors: Physics and Nanoengineering II*, Edited by I. Bozovic and D. Pavuna, (SPIE, Bellinghma, 1996). No month given.

Schmidl, F. et al. "Preparation and First Measurements of TBCCO Thin Film Intrinsic Stacked Josephson Junctions" *Supercond. Sci. Technol.*, 8 (1995), pp. 740–743. No month given.

Irie, Akinobu et al. "Growth and Tunneling Properties of $(Bi,Pb)_2Sr_2CaCu_2O_y$ Single Crystals" *IEICE Trans. Electron.*, vol. E77–C, No. 8, Aug. 1994, pp. 1191–1198.

Yasuda, T. et al. "Josephson Effects in Bi–2212 Single Crystals" *Supercond. Sci. Technol.* 9 (1996), pp. A170–A173. No month.

Yurgens, A. et al. "In Situ Controlled Fabrication of Stacks of High–$T_c$ Intrinsic Josephson Junctions" *Appl. Phys. Lett.*, 70 (13), Mar. 31, 1997, pp. 1760–1762.

Seidel, P. et al. "Investigations on High–$T_c$ Thin Film Intrinsic Stacked Josephson Junctions" pp. A9–A13. 1996 No month.

Xiao, Y.G. et al. "Fabrication of Stacked Intrinsic Josephson Junctions From $Bi_2Sr_2CaCu_2\ O_{8+x}$ Thin Films" *Supercond. Sci. Technol.*, 9 (1996), pp. A22–A25. No month given.

Schlenga, K. "Subgap Structures in Intrinsic Josephson Junctions of $Tl_2Ba_2Ca_2Cu_3O_{10+\delta}$ and $Bi_2Sr_2CaCuO_{8+\delta}$" *Physical Review Letters*, vol. 76, No. 26, Jun. 24, 1996, pp. 4943–4946.

Tanimura, Junji et al. "(01n)–Oriented BiSrCaCuO Thin Films Formed on $CeO_2$ Buffer Layers" *Jpn J. Appl. Phys.*, vol. 32 (1993), Part 2, No. 2B, Feb. 15, 1993, pp. L254–L256.

Suzuki, Y. et al. "Anisotropic Transport Properties of in–plane–aligned α–axis $YBa_2Cu_3O_7$ Films" *Physical Review B*, vol. 48, No. 14, Oct. 1, 1993–II, pp. 10 642–10 645.

Badaye, Massoud et al. "Superconducting α–axis–oriented $Nd_{1+x}Ba_2Cu_3O_{7-d}$ Thin Films Deposited by Laser Ablation" *Supercond. Sci. Technol.*, 8 (1995), pp. 638–641. No month given.

Kataoka, M. et al. "In–Plane Orientation of $Bi_2Sr_2CaCu_2O_x$ Thin Films on (110) $SrTiO_3$ Vicinal Surfaces" *Physical Review B*, vol. 47, No. 13, Apr. 1, 1993–I, pp. 8316–8319.

Bozovic, Ivan and Eckstein, J.N. "Analysis of Growing Films of Complex Oxides by RHEED" *Materials Research Society MRS Bulletin*, vol. XX, No. 5, May 1995, pp. 32–38.

Bozovic, Ivan and Eckstein, J.N. "Transport in Atomically Engineering BiSrCaCuO Multilayers" *Journal of Superconductivity*, vol. 8, No. 5, 1995, pp. 537–540. No month given.

Eckstein, J.N. et al. "Atomic Layer–by–Layer Engineering of High $T_c$ Materials and Heterostructure Devices" *MRS Bulletin*, Sep. 1994, pp. 44–50.

Irie, A. et al. "Novel Microwave–Induced Steps of Intrinsic Josephson Junctions in Mesa–Shaped BSCCO Single Crystals" *Supercond. Sci. Technol.*, 9 (1996), pp. A14–A17. No month.

Bozovic, Ivan and Eckstein, J.N. "Atomic–Layer Fabrication of High–$T_c$ Tunnel Junctions" *Journal of Alloys and Compounds*, 251 (1997), pp. 201–205. No month.

Eckstein, J.N. et al. "Control of Comnposition and Microstructure in High–Temperature Superconductors at the Atomic Level by Molecular Beam Epitaxy" *MRS Bulletin*, Aug. 1992, pp. 27–33.

Eckstein, J.N. and Bozovic, I. "High–Temperature Superconducting Multilayers and Heterostructures Grown by Atomic Layer–by–Layer Molecular Beam Epitaxy" *Annu. Rev. Mater. Sci.*, 1995, pp. 679–709. No month.

Eckstein, J.N. et al. "Control of Comnposition and Microstructure in High–Temperature Superconductors at the Atomic Level by Molecular Beam Epitaxy" *MRS Bulletin*, Aug. 1992, pp. 27–33.

Régi, F.X. et al. "70 K Hysteretic Josephson Effect in Mesas Patterned on (Bi,Pb)phd $2Sr_2CaCu_2O_y$ Single Crystals" *J. Appl. Phys.*, 76(7), Oct. 1, 1994, pp. 4426–4428.

* cited by examiner

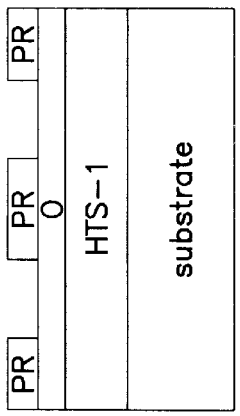
FIG. 4A
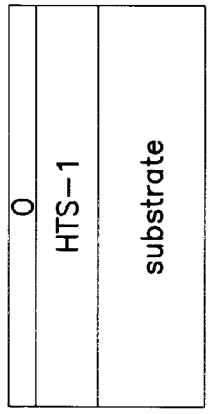
FIG. 4D
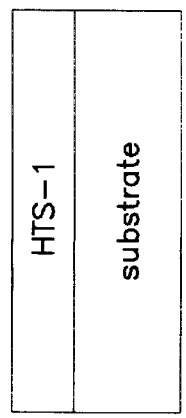
FIG. 4G
FIG. 4B
FIG. 4E
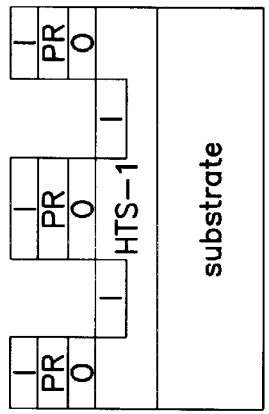
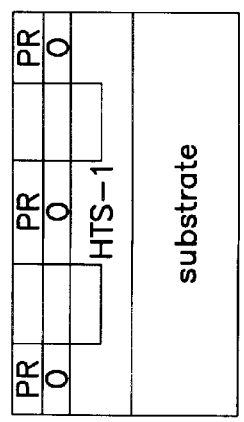
FIG. 4H
FIG. 4C
FIG. 4F
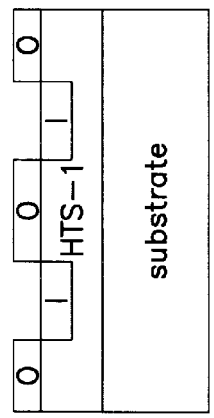
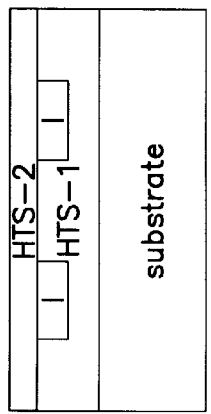
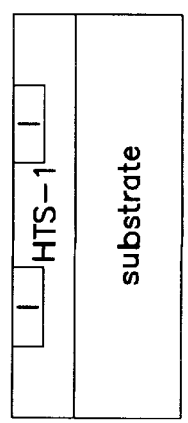

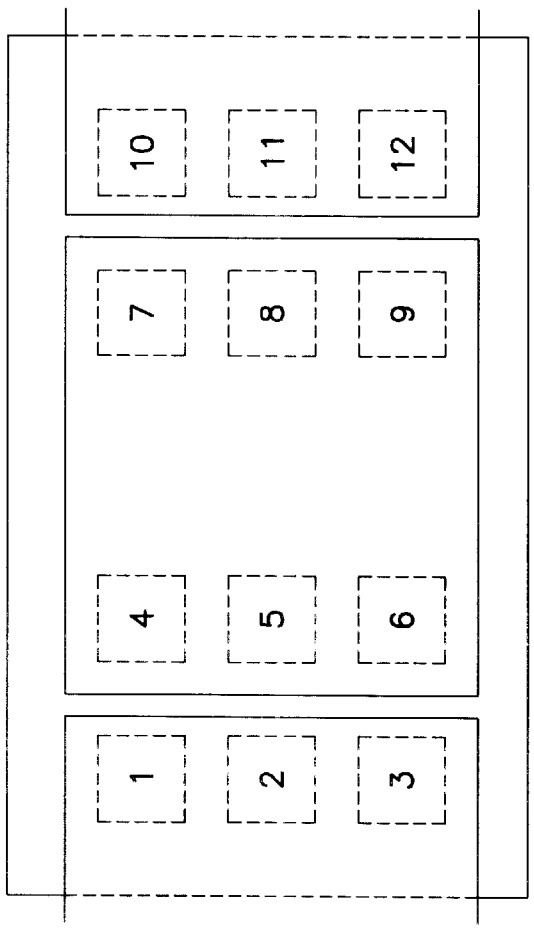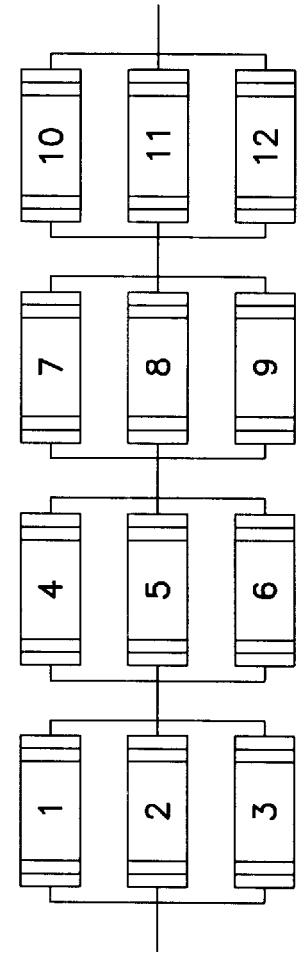
FIG. 7I
FIG. 7J

JOSEPHSON JUNCTION ARRAY DEVICE, AND MANUFACTURE THEREOF

BACKGROUND OF THE INVENTION (a) Field of the Invention

The invention relates to superconducting devices, corresponding technologies and application fields, and more specifically to a novel generator and detector of sub-millimeter electromagnetic radiation, and its multiple applications.

(b) Description of the Related Art

1. Arrays of Artificial Junctions

The first realization of potential usefulness of Josephson junctions as tunable microwave sources and detectors can be traced back to the earliest works of B. Josephson and S. Shapiro. It was also understood very early that a single Josephson junction emits with too little power and too broad linewidth to be useful as a practical microwave source. These deficiencies can be removed by using arrays of Josephson junctions [Jain et al. 1984; Bindslev Hansen and Lindelof 1984; Lukens 1990]. If the coupling between the junctions is strong enough, phase locking may occur between them; in this cases, the array emits coherent radiation [Lukens 1990; Konopka 1994]. Possible coupling mechanisms and coupling strengths have been analyzed in detail [Jain et al. 1984; Lukens 1990]. It has been understood that the linewidth of the electromagnetic radiation emitted from an array of Josephson junctions decreases as the number of junctions within the array is increased, and can become very narrow in large arrays [Lukens 1990; Wiesenfeld et al. 1994; Konopka 1994].

Power of the emitted radiation also increases with the number of junctions in the array, and in large arrays it can become large enough ($P \geqq 1$ mW) for many practical applications [Bindslev Hansen and Lindelof 1984; Jain et al. 1984; Konopka et al. 1994; Wiesenfeld et al. 1994]. It is important here that a good impedance matching is achieved with the load, because in the opposite case most of the radiation is reflected back and dissipated within the device itself [Jain et al. 1984; Bindslev Hansen and Lindelof 1984; Konopka 1994].

Another concern are various junction parasitics; for example, junction capacitances are a source of power reduction at higher frequencies [Lukens 1990; Wiesenfeld et al. 1994]. This favors small-area Josephson junctions. Another argument pointing to the same conclusion is increased noise and linewidth broadening in large-area junctions [Kunkel and Siegel 1994; Konopka 1994]. Technically, for $w \geqq 4\lambda_j$, where w is the junction width and $\lambda_j$ is the Josephson penetration depth, the current flow becomes inhomogeneous [Kunkel and Siegel 1994]. It has been understood also that to achieve complete phase locking in an array of coupled Josephson junctions, it is necessary that all the junctions within the array have similar critical currents ($I_c$); in general, uniformity of $\pm 5\%$ or better is required for linear arrays [see e.g. Konopka 1994].

It is possible to relax somewhat the above stringent requirements by using a distributed arrays of equidistant Josephson junctions (see FIG. 8), provided that the operating frequency is adjusted in such a way to match the spacing between the junctions with the wavelength of the emitted electromagnetic radiation [Lukens 1990; Han et al. 1994]. This obviously reduces tunability in frequency, while the power of the emitted radiation can be increased significantly.

There have been numerous experimental studies of Josephson junction arrays, and some remarkable results have been achieved. Most of these were based on conventional (low-$T_c$) superconductors, e.g. using Nb/Al—AlO$_x$/Nb, trilayer junctions. Complete phase locking has been demonstrated in a linear array of 100 such junctions [Han et al. 1993]. In some cases, a broad-band antenna (for example, a bow-tie antenna, or a two-arm logarithmic spiral antenna), was integrated on the chip, and off-chip radiation was detected and measured. In other cases, another Josephson junction was integrated on-chip and coupled via a transmission line to the array. Some of the best results include the following ones. Emission of $P=50$ $\mu$W at $\nu=400$–500 GHz was observed from a distributed array of 500 Josephson junctions [Han et al. 1994]. In another circuit design (10×10 array), radiation was generated with a linewidth as small as $\Delta\nu=10$ kHz, tunable over a broad range, $\nu=53$–230 GHz [Booi and Benz 1994].

With the discovery of high-temperature superconductivity in La—Ba—Cu—O by G. Bednorz and K. A. Müller in 1986, and subsequent improvements of the critical temperature in related cuprate compounds up to $T_c$>160 K, great expectations have arosen for superconductive electronics, operational at liquid nitrogen temperature and even above it. Indeed, Josephson junctions have been fabricated since 1987 in dozens of laboratories worldwide, by a variety of techniques. Emission due to ac Josephson currents are artificial high $T_c$ Josephson junctions was measured and analyzed [Kunkel and Siegel 1994]. In the same study, phase locking of two step-edge junctions was demonstrated over a broad frequency range of $\nu=80$–500 GHz. In larger arrays, only partial (up to 4 junctions) and rather unstable phase locking was observed [Konopka 1994]. This was understood to originate from a generically large non-uniformity of such step-edge high-$T_c$ Josephson junctions, where critical current variations of $\pm 50\%$ are typical [Konopka 1990]. In another experiment five and ten-junction arrays, one next to the other, were fabricated using step-edge HTS junctions [Kunkel and Siegel 1994], again with only partial phase-locking and very small output power.

Artificial high-$T_c$ Josephson junctions and stacks are prerequisite in one embodiment of the present invention (see section V). They have indeed been fabricated successfully already [Bozovic et al. 1994, Bozovic and Eckstein 1995, 1996a,b; Eckstein et al. 1992, 1995, Ono et al. 1995] using atomic-layer-bylayer Molecular beam epitaxy (ALL-MBE). A variety of barrier layers have been explored, including Bi$_2$Sr$_2$CuO$_6$ [Bozovic and Eckstein 1996b], Bi$_2$Sr$_2$Dy$_x$Ca$_{1-x}$Cu$_2$O$_8$ [Bozovic and Eckstein 1996, 1995], Bi$_2$Sr$_2$Dy$_x$Ca$_{1-x}$Cu$_8$O$_{20}$ and BiSr$_2$Dy$_x$Ca$_{1-x}$Cu$_8$O$_{19}$ [Bozovic and Eckstein 1996, Eckstein et al. 1995], etc. High-resolution cross-sectional electron microscopy has shown virtually atomically perfect interfaces between the barriers and the superconducting electrodes [Bozovic et al. 1994b]. These multilayers were lithographically processed into mesa structures for vertical transport devices [Eckstein et al. 1992, Bozovic and Eckstein 1996b]. Both proximity-effect (SNS) junctions [Bozovic and Eckstein 1996b, 1995] and tunnel (SIS) junctions [Bozovic and Eckstein 1996a, Bozovic et al. 1994] have been fabricated in this way. They have shown remarkably high characteristic voltages, up to $I_cR_N=10$ mV (which corresponds to $\nu \approx 2.5$ THz) and uniformity of better than $\pm 5\%$ [Bozovic and Eckstein 1996a]. It was further demonstrated that the barrier properties such as its normal state resistance $R_N$ and critical current $I_c$ can be engineered over a very broad range (four orders of magnitude) by varying the doping level within the barrier, e.g., by varying x in the barrier layer consisting of Bi$_2$Sr$_2$Dy$_x$Ca$_{1-x}$Cu$_8$O$_{20}$ [Bozovic and Eckstein 1996a,b, 1995, 1994a; Eckstein et al.

1992]. Finally, some short vertical stacks of such Josephson junctions have already been fabricated and they showed perfect phase locking [Bozovic and Eckstein 1996b, 1994a; Eckstein et al. 1995; Ono et al. 1995]. In conclusion, every critical technological step related to fabrication of artificial trilayer Josephson junctions, and their vertical stacks, which we assumed to be feasible in Section V (iv). below, has already been successfully demonstrated and reduced to practice.

In many of the papers mentioned here, speculative statements were made about promising future applications of arrays of Josephson junctions. For example, applications are predicted as generators and detectors of GHz and THz radiation [Jain et al. 1984], and even more specifically in radio-astronomy and radio-spectroscopy of heavy molecules [Konopka 1994], in voltage standards [Ono et al. 1995], etc. No such applications have been realized (i.e., reduced to practice) so far, because of technical difficulties expounded above. It is generally understood that for useful off-chip spectroscopic applications, emitted power of more than 0.1 –1 mW is needed without sacrifice in tunability [Konopka et al 1994], and in reality this milestone has not been reached so far.

In the U.S. Pat. No. 3,725,213 to Pierce (1973) a superconductive barrier device and its fabrication technology is disclosed, which, besides other aims, provides for a generator or detector of millimeter and sub-millimeter radiation, based on a granular or particulate structure of the superconductor material. While enhanced radiation emission or sensitivity is intended by the summation of many Josephson junction-containing grains, there is little control and reproducibility, no phase locking, and complete load mismatch to vacuum. Although this device is capable of switching between the superconducting and normal conductivity state by means of a magnetic field, generated by an electrical pulse through a layer adjacent to the Josephson junction, no intention has been made to control the radiation emission frequency by virtue of the effect the magnetic field might have on the energy gap of the superconductor.

A superconducting device is disclosed in U.S. Pat. No. 4,837,604 to Faris (1989), which comprises a plurality of Josephson junctions, stacked vertically on top of one another, with series connection of stacks. It is tailored to a three terminal switch, intended to replace single junctions and lateral arrays of junctions in analog and digital switching applications. Radiation emission is not an aim of that device neither would the chosen design suite such objective.

In U.S. Pat. No. 5,114,912 to Benz (1991), a high-frequency oscillator based on a two-dimensional array of Josephson junctions is described. It is excited by the dc control current from an appropriate current source. The frequency of Josephson oscillations can be tuned continuously by adjusting this dc bias current.

Impedance matching to load can be achieved by selecting the appropriate number of Josephson junctions in the array or by adding resistive shunts. The perceived application of the device is as a tunable dc-to-ac converter at GHz and even THz frequencies.

One drawback of this device is that it is explicitly restricted to two-dimensional planar arrangements of Josephson junctions, which are placed next to one another on the chip. This geometry introduces severe limitations on the maximum possible number of junctions in such an array. Namely, the minimum area of a single junction is around 1 $\mu m^2$ because of limitations of photolithographic technology, uniformity requirements, the need to have a substantial critical current (not less than 1 mA for optimum power) and low-contact-resistance top lead (or leads). On the other hand, the phase-locking requirement restricts the lateral dimension of the array to about $\lambda/4$, which is about 75 $\mu m$ for $\nu$=1 Thz. Allowing for some spacing between junctions etc., one gets something like 1–2,000 for the maximum number of junctions in a phase-locking array of this design. In practice, arrays of 10×10 =100 junctions were made. As we will discuss in Section V (vii) below, this design does not allow for out-of-chip power of emitted microwave radiation at a level interesting for conceivable applications i.e. at least 0.1–1 mW. We will argue that alternative designs proposed here (in Section V) allow for much denser packing of Josephson junctions, artificial or intrinsic, and open prospects for sources with much higher emitted power, and by virtue of this property, for a variety of novel applications which are not possible with the planar array devices.

In the E.U. patent EP 446146 to Harada and Hozak (1987) a trilayer Josephson junction is disclosed, comprised of top and bottom superconducting electrodes made of $L_y Ba_2 Cu_3 O_4$, where $L_y$ is Y or a rare-earth element, and 6<y7, and a non-superconducting barrier made of $Bi_2 Y_x Sr_y Cu_z O_w$, where $0 \leq x \leq$, $1 \leq y \leq 3$, $1 \leq z \leq 3$, and $6 \leq w \leq 13$. In this patent, no information was provided about the properties of such junctions (such as $I_c$, $R_n$, I-V characteristics, microwave modulation properties, etc.). Nor is there any mention of formation of arrays, vertical or lateral, their expected properties, or applications.

A magnetic control mode for the emission frequency has been proposed for a device disclosed in the European Pat. No. 513,557 to Schroder (1992), where the device of that invention contains stacks of Josephson tunnel junctions, in a series superconducting connection.

In between each pair of neighboring SIS Josephson junctions, there is one more superconducting layer, which is insulated on both sides from the neighboring Josephson junctions. This layer is intended to be used as the control line: by running a current laterally through this layer, as already proposed in U.S. Pat. No. 3,725,213, one should generate a magnetic field which is intended to affect the SIS Josephson junctions by reducing the gap in the superconducting layers.

This device has several drawbacks, some of which make its reduction to practice impossible within the constraints of currently known materials parameters and available microfabrication technologies.

In particular, that patent description does not teach one how to fabricate the (series) superconducting contacts between superconducting electrodes of stacked SIS Josephson junctions, which is the critical technological step required to fabricate the device. It requires one to deposit superconducting pads of dimensions of about 1 $\mu m \times 0.01$ $\mu m$, on two opposite lateral sides of a vertical layered column structure.

There is no known technology today capable of performing such a task.

A further concern is the thickness required for the superconducting control line ($S_2$ in FIG. 1 of EP 513.557 A2) in order that it can generate a magnetic field strong enough to reduce the gap in the superconducting electrodes. Take, for example, a layer which is 10 nm thick, within a 1 $\mu m^2$ mesa.

Such small area mesas are required to keep the critical current of Josephson junction's small enough for the desired phase-locked operation, as will be expounded later. Asuming a very high critical current density of $j_c = 10^6 A/cm^2$ in this layer, one gets $I_c = a^2 \ j_c = 10^6 \ A/cm^2 \times 1 \ \mu m \times 10 \ nm = 10^6 \ A/cm^2 \times 10^{-1} \ cm \times 10^{-6} \ cm = 10^{-4} \ A$. At a distance of about 10 nm, this current would produce a magnetic field of about B≈0.01 Tesla. Such a field is several orders of magnitude too small to significantly affect the critical temperature and the superconductivity gap in the neighbouring superconducting electrodes. In high-$T_c$ superconductor materials, such as $YBa_2Cu_3O_7$ or $Bi_2Sr_2CaCu_2O_g$, magnetic fields of several Tesla are needed to get a measurable effect on $T_c$, and that only if the field is oriented perpendicular to the $CuO_2$ planes. In the geometry given in EP 513557 A2, the magnetic field would essentially be parallel to the $CuO_2$ planes.

In this unfavorable geometry, even the highest magnetic fields available today (over 50 T) essentially do not affect $T_c$ in high-$T_c$ superconductor materials, such as $Bi_2Sr_2CaCu_2O_g$. To overcome this difficulty, one would have to use much thicker control-line superconducting layers, say 1 $\mu$m thick or even thicker (e.g., 6 $\mu$m thick, as in U.S. Pat. No. 3,725,213). That, however, clashes with the current limitations for epitaxial growth of high-quality high-$T_c$ superconductor films (no more than few hundred nm). To fabricate a stack of several such devices would be even less possible.

An alternative approach would be to use some conventional (low-$T_c$) superconducting materials with much lower critical fields, i.e., much more sensitive to an applied magnetic field. However, apart from losing the advantages of a high $T_c$ (such as the possibility to avoid expensive and cumbersome very low temperature cryogenic systems), in this hypothetical embodiment of the discussed device, one would also lose the advantage of extremely thin superconducting electrodes which are possible if one employs the high-$T_c$ superconductor cuprate compounds. The superconductivity coherence lengths are much larger in conventional low-$T_c$ superconductors, and for that reason one would have to use much thicker superconducting electrodes. This, in turn, will also limit in practice the number of devices in a stack to only, few in contrast to what is assumed in the description of the device in EP 513557 A2.

On the other hand, while it is clearly impractical to modulate the gap and $T_c$ of the superconducting electrodes as proposed in EP 513557 A2, it is possible to introduce vortices in the barrier and control the critical current by an applied magnetic field. We will actually make use of this later in Section V.

Another problem is that of the device "cross-talk". Imagine that one could somehow resolve the problem of control lines and make them of some material that can carry strong enough currents and generate magnetic fields that can reduce the superconducting gap in the neighboring high-$T_c$ superconductor electrodes. The problem is that such a field would affect more than just one Josephson junction. To begin with, according to the design in EP 513 557 A2, for each control line there are two equidistant Josephson junctions, which should be equally affected. But since the magnetic field in the geometry under discussion will fall off slowly as a function of the distance from the control line, one would actually expect that it would affect every Josephson junction within that stack. So, individual Josephson junction control, although the principal aim of that proposal, is impaired with such a design.

A further major-drawback of the device design in EP 513 557 A2 is that no considerations were made of output power of the electromagnetic radiation to be generated. In particular, load matching to vacuum was not considered. As pointed out above, it would be impractical to make even a few-junction stack within that design. This would imply a substantial output-impedance load mismatch. In this case, most of the microwave radiation power would be reflected back and dissipated within the device itself The device would burn out before one is able to extract significant microwave power out of it.

In fact, optimization of a high-$T_c$ superconductor Josephson junction array for maximum output power requires in general both series and parallel superconducting connections, as we will show in detail in the upcoming section V.

To summarize, it is our conclusion that the device described in EP 513557 A2 has not been reduced to practice because of several drawbacks in its design, namely, (i) its fabrication requires the deposition of superconducting contacts about 0.01 $\mu$m wide on lateral sides of mesas that contain Josephson junction stacks, for which there is currently no known technology, (ii) there are no known superconductors that can sustain currents large enough to generate magnetic fields strong enough to reduce the superconducting gap in the high-$T_c$ superconductor Josephson junction electrodes, within the dimensional constraints of the device, (iii) the magnetic fields if generated would affect more than one Josephson junction (i.e., there would be inadmissible 'cross talk' between individual devices within the same stack), and (iv) output power would be too low for the proposed system applications, in part because the device design does not allow for Josephson junction array circuit optimization.

It is the purpose of this patent to disclose a device of the invention that overcomes all the drawbacks discussed above.

2. Intrinsic Josephson Junction Stacks in Cuprate Superconductors

In the very first paper on cuprate superconductors in 1986, J. G. Bednorz and K. A. Müller expressed an opinion that La—Ba—Cu—O is a quasi-two-dimensional superconductor, in view of its pronounced layered structure. Subsequently, this hypothesis has been confirmed by a variety of experimental findings on various cuprate superconductors (see e.g. Bozovic 1991), the most direct of which was the observation of high-$T_c$ superconductivity in one-unit-cell thick layers of $Bi_2Sr_2CaCu_2O_8$ [Bozovic et al. 1994a]. On the other hand, the critical current along the c-axis (i.e., perpendicular to the $CUO_2$ layers) is much smaller than in a direction parallel to the $CUO_2$ planes, However, it is not zero, i.e., supercurrent can run in the c-axis direction. This clearly implies that the planar, quasi-2D superconducting slabs are weakly coupled by Josephson tunneling In other words, cuprate superconductors can be viewed as natural (native, intrinsic) stacks of Josephson junctions, spaced at 6–25 Å. A theoretical model for a stack of Josephson coupled superconducting layers was introduced already 25 years ago [Lawrence and Doniach 1971], and studied in much detail since then. The predictions include nonlinear I-V characteristics, microwave-radiation induced I-V (Shapiro) steps, and microwave emission from a sample under dc voltage bias.

Indeed, all these signatures were observed in cuprate superconductors, first in $Bi_2Sr_2CaCu_2O_8$ [Keiner et al. 1992] and subsequently also in $(Pb_yBi_{1-y})_2Sr_2CaCu_2O_g$, $Tl_2Ba_2Ca_2Cu_3O_{10}$, etc. [Kleiner and Müller 1994, Müller 1994, 1996] and by several groups [Regi et al. 1994, Irie et al. 1994, Schmidl et al. 1995, Yasuda et al. 1996, Tanabe et al. 1996, Yurgens et al. 1996, Seidel et al. 1996, Xiao et al. 1996]. Most of these results were obtained on small single crystals, but some work was also done on mesas lithographically defined on single crystals or thin films [Schlenga et al. 1995, Müller 1996, Schmidl et al. 1995]. In some cases, phase locking of over 1,000 native junctions was observed [Schlenga et al. 1995]. In general, phase locking was only partial, as evidenced by the appearance of multiple branches in I-V characteristics (in all works published so far). Namely, if the Josephson junctions that belong to a stack are not all identical, i.e., if their critical currents vary from one junction to another, they will not all switch to the normal state at the same point as the bias current is increased. Correspondingly, emission from such an array is expected to be a superposition of coherent (narrow-band) and incoherent (broad-band) radiation, and indeed this was observed [Schienga et al. 1995, Müller 1996]. These variations in Josephson junction characteristics are believed to arise from imperfections in the crystal growth and in the lithographic process of defining mesa structures, such as variations in the mesa cross-section area. [We will address this problem in Section V. (iv) below]. The highest frequency of the emitted radiation detected so far was v=95 GHz, due to limited detection capabilities [Müller 1996]. The power of detected radiation was minuscule, less than 1 pW, partly due to gross load-impedance mismatch. No practical devices or applications have been reported so far, although some speculations about conceivable future applications for sub-millimeter radiation sources were put forward [Schlenga et al. 1995].

SUMMARY OF INVENTION (PROPERTIES)

It is therefore an object of the present invention to provide means for avoiding some or all of the above difficulties.

It is another object of this invention to provide a novel generator and/or detector of sub-millimeter electromagnetic radiation, which applies simultaneously a plurality of vertically stacked Josephson junctions connected into a two-dimensional network, so that the generation of microwave power is considerably enhanced.

It is another object of this invention to provide a novel sub-millimeter radiation device with an array impedance that allows an impedance matching to the load, this providing maximum off-chip emission power.

It is another object of this invention to provide a novel sub-millimeter radiation device having a remarkably small emission linewidth (less than one millionth of the radiation frequency v), within its sub-millimeter waveband up to the emission frequency of several Thz.

It is another object of this invention to provide a novel sub-millimeter radiation device with an electronic control mode which allows one to continuously vary the emission frequency and/or to tune the detection frequency, over a broad spectral range.

It is another object of this invention to provide a novel sub-millimeter radiation device, whose emitted microwave intensity can be modulated electronically, including an on/off mode, providing also a fast electronic switch for superconducting electronic circuits.

It is another object of this invention to provide a novel sub-millimeter radiation device of which the main emission direction of the wave field (i.e., the propagation vector of the plane wave) can electronically be rotated within the propagation plane, providing for a sweeping property of the device in both the emission and the detection mode.

It is another object of this invention to provide a novel sub-millimeter radiation device, of which the emitted wave field can electronically be split into two or more parts, and each can be controlled separately, allowing among other features for focusing and defocusing of the combined wave field.

It is another object of this invention to provide a novel sub-millimeter radiation device capable of emitting and/or detecting independently, and even simultaneously, at different fixed (pre-determined) or electronically varied and controlled frequency channels.

It is another object of this invention to provide a novel sub-millimeter radiation device of which the emission and detection mode can be inverted by external electronic means.

It is another object of this invention to provide a novel sub-millimeter radiation device, suitable for its incorporation into superconductor/semiconductor hybrid systems.

These and other objects are achieved according to the present invention by providing a two-dimensional network of linear column-shaped superconducting elements, each of which contains a series array of vertically stacked Josephson junctions, being further this column-shaped superconducting elements grouped in a pre-designed manner under electrical contact plates, carrying additionally said contact plates means for an external electronic control In addition to this the claims 1 to 35.

(A) Each Josephson junction array column may carry its own electrical contact (1, 2, 3, 4, 5, 6, etc.).

(B) Parallel connection of several active elements. Top superconducting contacts may unite several mesas (Josephson junction array columns) in groups (segments), each of which is controlled electrically.

(C) A device of invention: Short Josephson junction array with two segments of Josephson junction array columns connected in series by superconducting top and bottom electrodes (c) and (d), respectively.

(D) A device of invention: A more complex circuit involving both parallel and series superconducting connections of linear Josephson junction arrays (contained in vertical column structures). Segmented electrical contacts, top (c), and bottom (d) for the series connection of n segments ($1 \leq n \leq 1000$).

Figure 3B:
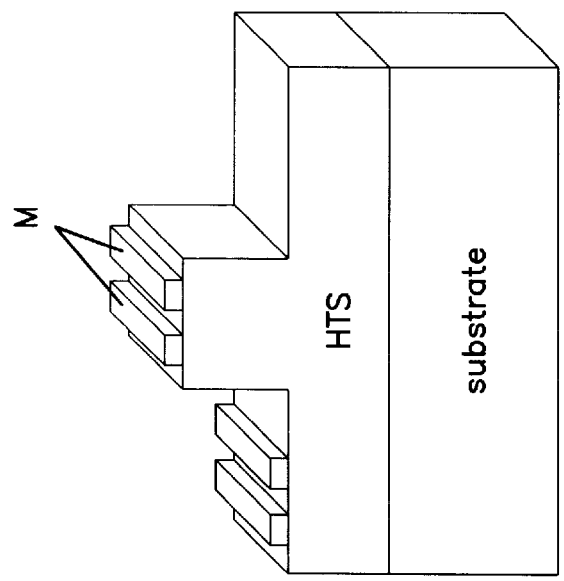
Figure 3A:
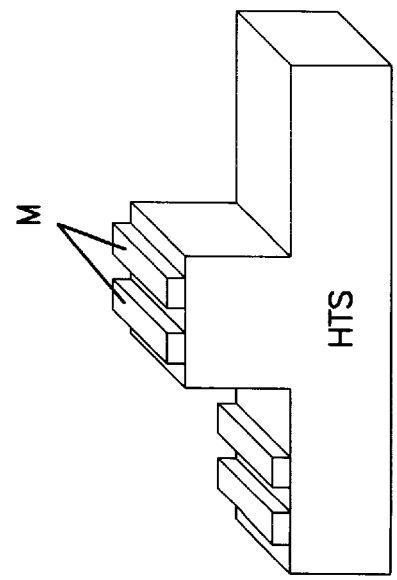

FIG. 3: (A) Single crystal of a high-$T_c$ superconductor etched into a mesa structure (M-metal contact pads).

(B) Epitaxial thin film of high-$T_c$ superconductor etched into a mesa structure.

FIG. 4: In-situ fabrication of the superconducting top electrode (schematic representation, not to scale.)

(A) Deposit a high-$T_c$ superconductor film (HTS-1).

(B) Cool down and cover it with the protective overlayer.

(C) Spin-on, expose and develop the photoresist (PR) with openings for mesa definition.

(D) Ion mill through the protective overlayer and about halfway through the high-$T_c$ superconductor (HTC-1) layer.

(E) Deposit insulating material I.

(F) Dissolve PR and lift-off insulator on top of the mesas.

(G) Bring the film back to the growth chamber, heat it up so that the protective overlayer evaporates away leaving a pristine top surface of high-$T_c$ superconductor (HTS-1) mesas.

(H) Deposit a high-$T_c$ superconductor layer (HTS-2).

FIG. 5: (A) A fragment of the device in FIG. 4, showing mesas containing a weak link Josephson junction (WL) at the interface between two high-$T_c$ superconductor layers (HTS-1 and RTS-2), and having a widened bottom part as the result of the ion-milling process.

(B), the same for the case of wet etching, where the mesas have constricted bottom parts as a result of under-etching. Artificial Josephson junctions (AJJs) are placed only in the central portion of the mesa, thus avoiding non-uniformities from both ends.

FIGS. 6 (1) and 6(2): Fabrication of parallel superconducting contacts between three linear Josephson junction arrays in mesa structures.

(A) Deposit the first high-$T_c$ superconductor film (HTS-1) and protective overlayer, O.

(B) Spin-on, expose, and develop photoresist R for mesa etch;

(C) Etch or ion-mill to define mesa structures.

(D) Deposit insulator I.

(E) Dissolve photoresist and lift-off insulator above it.

(F) Remove the protective overlayer by evaporation within the growth chamber.

(G) Deposit the second high-$T_c$ superconductor layer (HTS-2).

(H) Spin-on, expose and develop photoresist for the cluster definition etch.

(I) Etch or ion-mill to define the cluster structure.

(J) Dissolve photoresist.

(K) Deposit metal contacts on the top and the bottom high-$T_c$ superconductor electrodes.

FIG. 7(1)–7(3):. Series connection of mesas or parallel connections of mesas.

(A) Deposit high-$T_c$ superconductor (HTS-1) and protective overlayer, etch to define mesas, deposit insulator, and remove photoresist. (Side view).

(B) Top view of cluster structure with four mesas, after the step A.

(C) Etch away the trench separating the two clusters, deposit insulator, and remove photoresist. (Side view).

(D) Top view of the same wafer after the step C is completed.

(E) Remove the protective overlayer and deposit the second high-$T_c$ superconductor layer (HTS-2). Spin-off photoresist, align carefully, expose and develop, and etch the trenches in the high-$T_c$ superconductor (HTS-2) layer to separate the clusters. (Side view).

(F) Top view after the step E.

(G) The current path in the structure shown in E.

(H) The equivalent circuit for the structure shown in E; each box represents a series Josephson junction array contained within one mesa.

(I) A cluster of mesas containing both parallel and series connections.(Top view).

(J) The equivalent circuit for the Josephson junction array network shown in (I).

Figure 8:
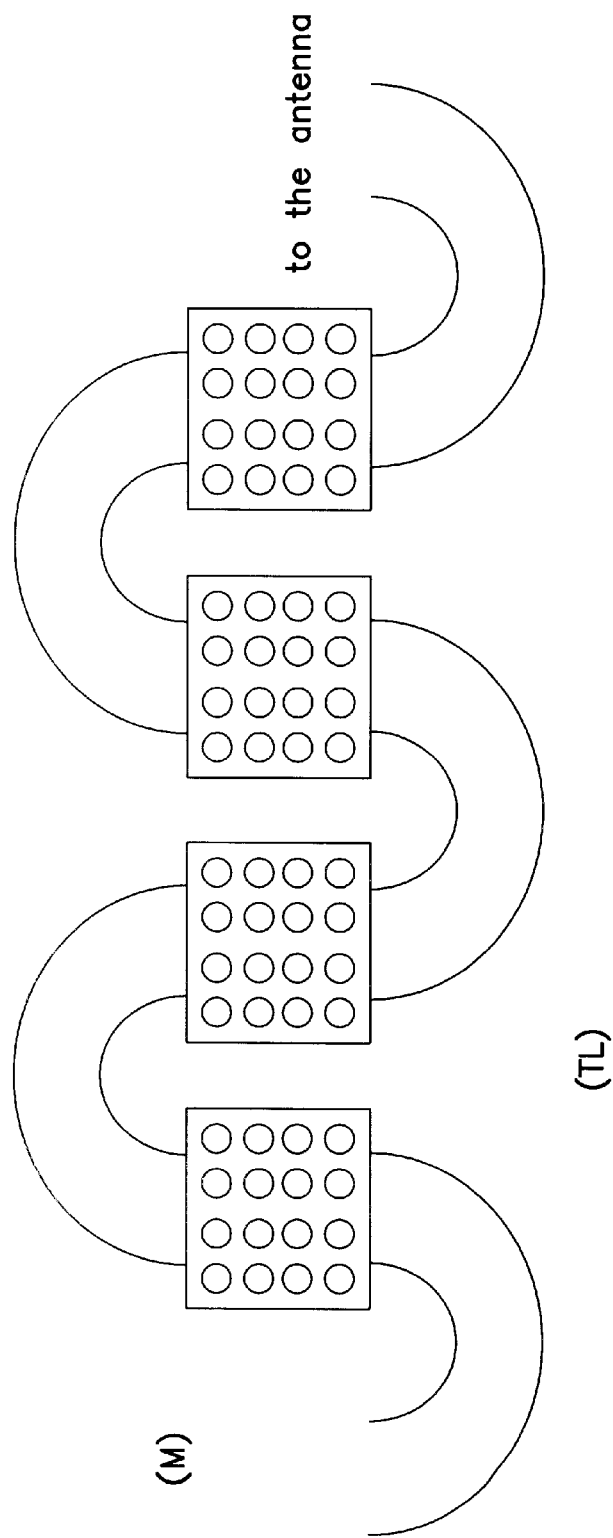
Figure 9B:
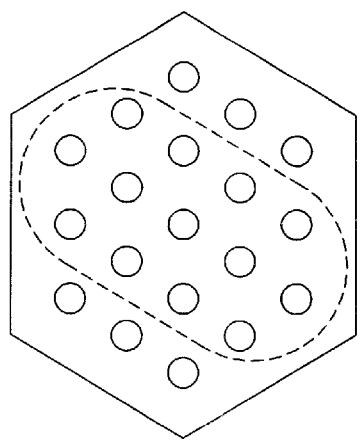
Figure 9D:
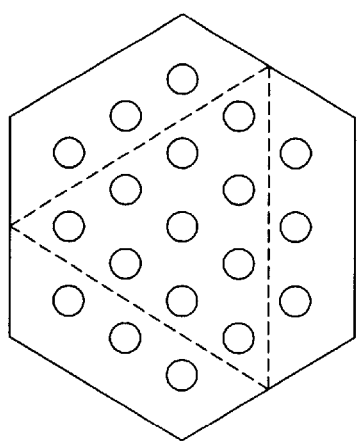
Figure 9A:
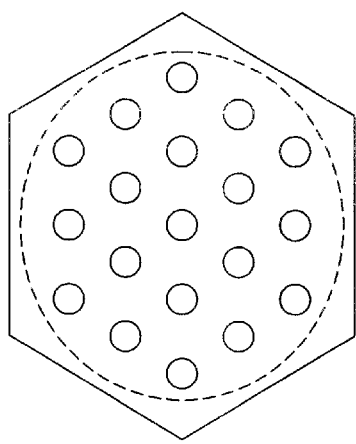
Figure 9C:
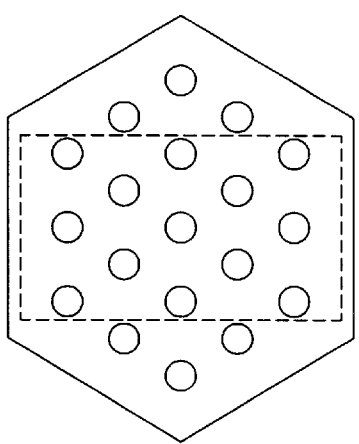

FIG. 8: Distributed array of clusters of mesas, each containing a stack of Josephson junctions, connected by a transmission line. The distance between clusters is equal to λ, the wavelength of the electromagnetic wave within the structure.

FIG. 9: A schematic representation of four different working configurations of the AA-Tunneltron. A two-dimensional array of mesas is shown, each containing a linear stack of Josephson junctions. Each mesa is controlled separately, where shaded circles represent the inactive (switched-off) mesas and open circles represent the active (emitting) mesas.

DETAILED DESCRIPTION OF THE DEVICE OF INVENTION

Figure 1:
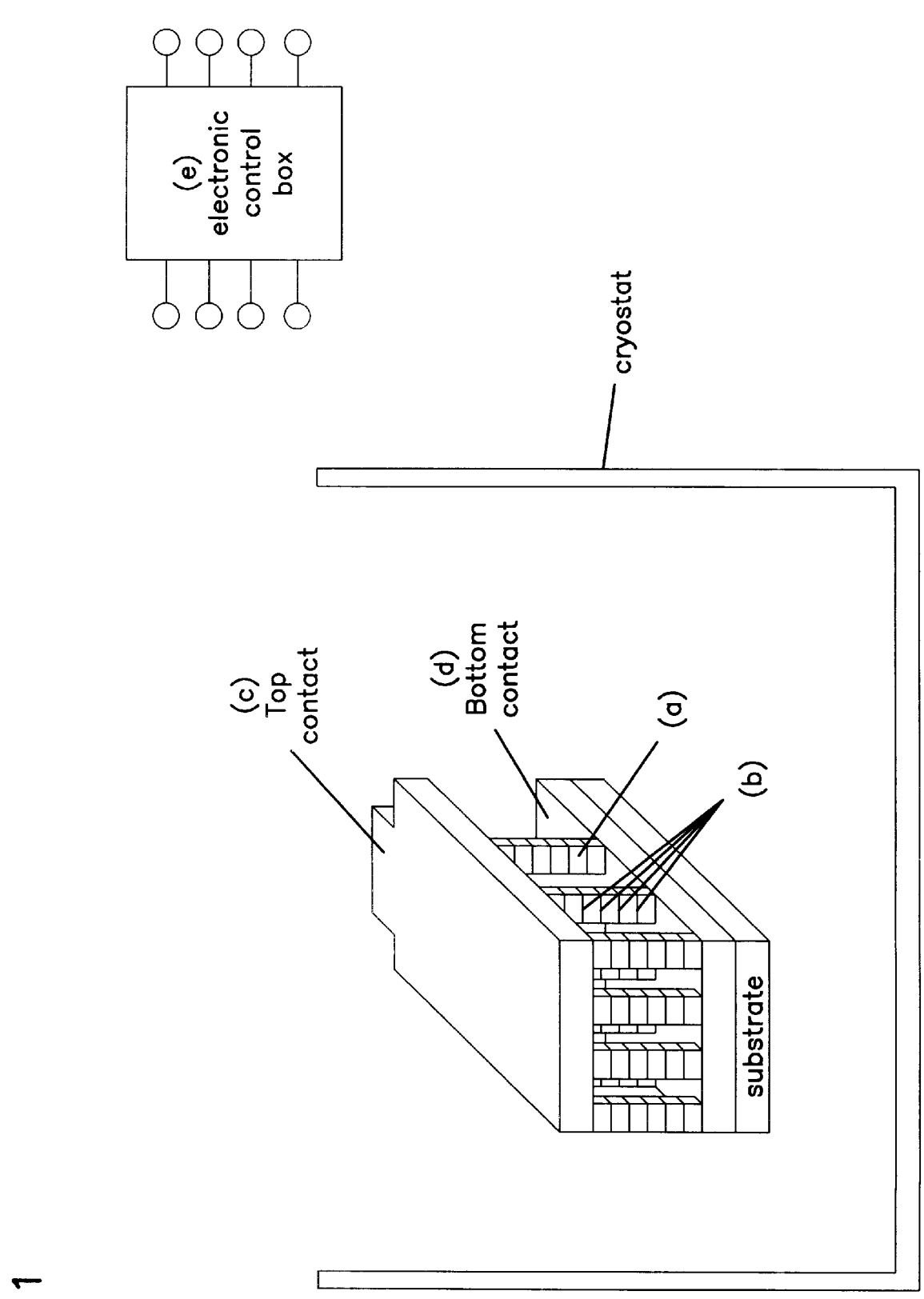
FIG. 1: A device of invention: Basic design of a two-dimensional lateral array of column-shaped elements (mesas) (a) with stacked Josephson junctions (b), top contact (c), and bottom contact (d). In (e), the electronic control unit is contained.
Figure 2A:
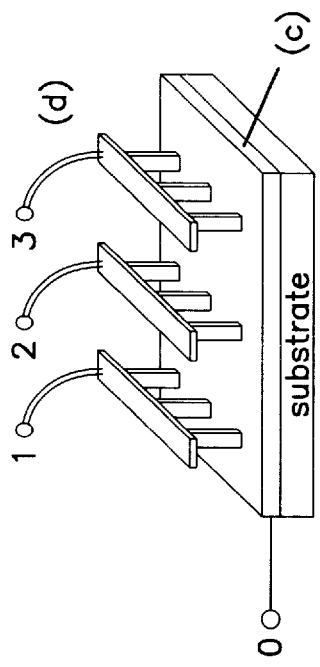
FIG. 2: Electrical connections to mesas (column-shaped active elements).
Figure 2B:
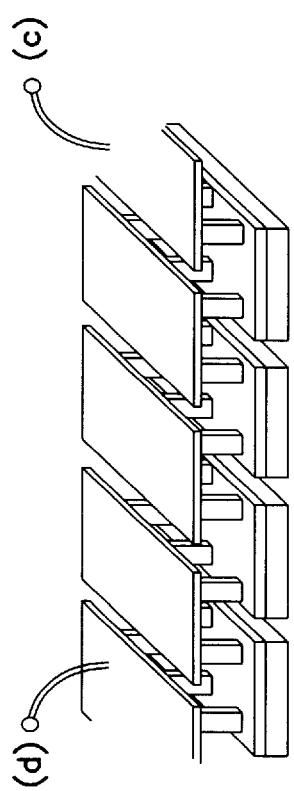
Figure 2C:
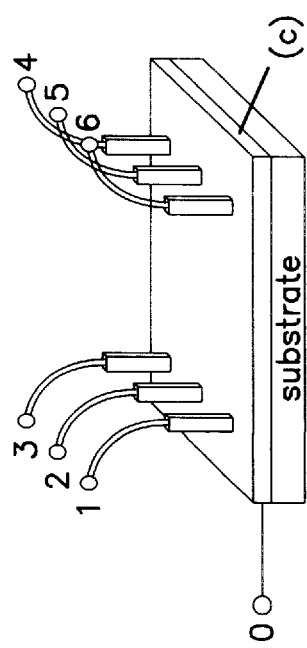
Figure 2D:
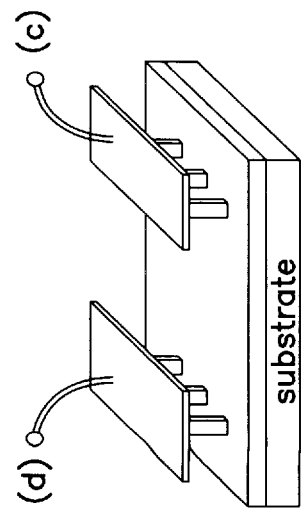

In FIGS. 1. and 2 Josephson junction arrays are shown according to the invention. They are comprised of arrays of vertical column-shaped superconducting elements (a), each of which represents a series array of stacked Josephson junctions (b), built up between a bottom superconductor (c) and a top superconductor (d), both providing superconducting electrical contact areas. In the case of FIG. 2c., the top superconductor layer (d) is divided into two or more segments, while in FIG. 2.d. additionally the bottom superconductor (c) is divided into segments, too. These segments can be electrically connected in different ways, thus allowing for optimization of circuit parameters (such as load impedance matching) as well as for various control modes selected according to the intended use of the device as a microwave radiation emitter or a radiation detector.

In the case of conventional (low-temperature) superconductors, the superconductor and barrier layers that form Josephson junctions are stacked alternately so that there is a barrier layer between every pair of superconductor layers.

In the case of high-temperature superconductors mainly chosen for this invention, Josephson junctions may also be formed naturally, given a single crystal growth mode.

For the standard devices of FIGS. 1. and 2, the bottom superconductor (c) is common for all active elements, while the top superconductor (d) may be divided into two or more parts, with every part (segment) of the upper contact being provided with its own electrical contact pad. The number of such segments may be smaller or equal to the number of columns which contain linear arrays (stacks) of Josephson junctions.

For the devices of FIG. 2.D., the bottom superconductor (c) is divided into two or more parts, where every part (segment) is provided with its own electrical contact pad, too.

Although arrays with a small number of columns, which contain stacks (series arrays) of Josephson junctions are shown in the figures, any number of superconductive elements (columns) can be chosen.

For the Josephson-junctions in every active column-shaped superconducting element, very high numbers are achieved particularly with high-$T_c$ superconductor materials. As each junction is tightly coupled to the next, the entire stack will phase-lock in the emission regime.

(i) As explained in the previous chapter IV, high-temperature cuprate superconductors can be perceived as natural superconducting superlattices of SIS . . . , SNS . . . , or SINIS . . . type. A simple way to produce a linear array of such native Josephson junctions is by fabricating a mesa structure such as shown in FIG. 3. One can use, for example, $Bi_2Sr_2CaCu_2O_8$, $Tl_2Ba_2Ca_2Cu_3O_{10}$, $HgBa_2CaCu_2O_{6.2}$, $La_{1.85}Sr_{0.15}CuO_4$, etc., in form of single crystals or epitaxial thin films. The mesa structures can be fabricated by standard photolithographic techniques including wet etching, ion milling, etc. Such mesa structures have been fabricated by several groups [Kleiner and Müller 1994, Müller 1994, Müller 1996, Regi et al. 1994, Schmidl et al. 1995] and they indeed showed non-linear I-V characteristics with multiple branches, switching between branches, and hysteresis, as well as Shapiro steps induced by microwave radiation, and microwave emission.

(ii) However, I-V characteristics and other properties of these mesa structures have been far from those expected for an ideal phase-locked linear Josephson junction array. In particular, the observed emission powers were minuscule, in the pW-region, and hence such Josephson junction arrays are of no technological value.

This came from three principal reasons: (a) the junctions were not uniform in $I_C$ and $R_N$, (b) the junction areas were large in general, typically about $30 \times 30 \, \mu m^2 \approx 10^{-5} cm^2$, and (c) the circuits were not optimized for out-of-chip microwave emission. In view of (a) and (b), phase locking was imperfect, random, and unstable. Native Josephson junctions in cuprates show relatively large c-axis critical current densities ($\approx 10^4$–$10^6 A/cm^2$), so such junctions have way too large critical currents, 100 mA or more. Such large Josephson junctions have many complex modes of excitation, with supercurrents running in both directions, fluxon motion, etc. While aware of these difficulties, researchers in the mentioned groups were unable to significantly reduce the junction area, because of contact resistance problems. With too large contact resistance there is a substantial heating of the junction stack from above, which introduces non-uniformity in critical currents and obstructs phase locking. In extreme cases, the Josephson junction array device burns out.

(iii) Our first improvement over the existing art is a method to resolve the above contact resistance problem by depositing in-situ superconducting (i.e., zero-resistance) contacts. This method enables making native Josephson junction arrays of very small area, e.g. 1 $\mu m^2$ and even smaller. Specifically it also avoids forming of a weak link between the mesa and the top superconducting electrode.

(Such a weak link could introduce a Josephson junction with smaller critical current, in series with the native Josephson junction arrays, which could dominate the response and diminish the Josephson junction array performance). The process is described in FIG. 4.

We start by (A) depositing an epitaxial thin film of a high-temperature superconductor (HTS-1), such as $La_{1.85}Sr_{0.15}CuO_4$, $Bi_2Sr_2CaCu_2O_8$, $Tl_2Ba_2Ca_2Cu_3O_{10}$ or $HgBa_2CaCu_2O_{6.2}$, a suitable substrate such as $SrTiO_3$, $LaAlO_3$, MgO, etc., possibly with one or more buffer layers (such as $CeO_2$, $Bi_2Sr_2CuO_6$, etc.) to improve epitaxy. The deposition method can be thermal evaporation (e.g. molecular beam epitaxy, MBE), sputtering, pulsed laser deposition (PLD), chemical vapor deposition (CVD), liquid-phase epitaxy (LPE), etc.

(B) Then we cool down the sample without removing it from the growth chamber, and in this step we deposit a protective overlayer (O) on top of the high-$T_c$ superconductor (HTS-1). This compound should be chemically inert relative to the superconductor material, i.e., there should be no chemical interaction among these two compounds.

It should also be volatile, i.e., it should evaporate away at some intermediate temperature $T_I$ less than the growth temperature $T_s$ used for the deposition of the high-$T_c$ superconductor film (usually $T_s$=600–750° C.). Examples of materials suitable for the protective overlayer are volatile metals such as Pb, Sn, Bi, etc., organic molecules, such as $C_{60}$, etc.

(C) The film is then removed from the growth chamber and, using standard photolithography, covered with photoresist which is exposed via a suitable mask and developed to leave openings for etching.

(D) The film is then brought into a chamber for ion milling, and mesas are defined by ion mining through the protective overlayer and approximately halfway through the high-$T_c$ superconductor layer HTS-1. It is important that there remains enough undamaged high-$T_c$ superconductor film at the bottom of the trench (say 100 Å or more) so that there is a good superconducting contact from below (the bottom high-$T_c$ superconductor electrode). Any other etching procedure, such as dry or wet etching, can be used as well, as long as the etching rate can be controlled, so that etching can be stopped before it reaches the substrate and disconnects the bottom electrode.

(E) Without removing the film from the processing chamber, and using the same photoresist, we deposit the insulating layer (I). Suitable materials include $SiO_2$, $CeO_2$, $SrTiO_3$, $ZrO_2$ or YSZ (yttrium stabilized zirconia), etc. A suitable method is, for example, electron-beam evaporation. Physical vapor deposition under high vacuum conditions ensures directional deposition and should make subsequent lift-off easier.

(F) Now we take the film out of the processing chamber and remove the photoresist by an appropriate solvent (e.g., acetone), lifting off the insulator above the photoresist.

(G) We bring the film back to the growth chamber and heat it up to the standard high-$T_c$ superconductor deposition temperature $T_s$ (say 600–750° C). Since $T_s > T_I$, the protective overlayer evaporates away, leaving pristine high-$T_c$ superconductor surfaces at the mesa tops. In this step, it is possible to use different reactive gases (e.g., fluorine) which interact with the overlayer material and etch it away, but do not react with high-$T_c$ superconductor compound.

(H) Finally, we deposit another layer of high-$T_c$ superconductor (HTS-2) to act as the top high-$T_c$ superconductor electrode. Additional processing may include depositing thicker metal contacts on the bottom (HTS-1) and top (HTS-2) electrodes, as it is shown in FIG. 3.

(iv) Our next improvement over the previous art, as well as over the method described in section (iii) above, is to use artificial rather then native Josephson junctions. For that purpose, one can use the technique of doping selective unit-cell layers such as described in the literature [Bozovic et al. 1994a,b, 1996a,b; Bozovic and Eckstein 1995, Eckstein et al. 1992, 1995]. For example, one can dope with $Y^{3+}$ or $Dy^{3+}$ onto Ca sites in $Bi_2Sr_2CaCu_2O_8$, or dope with Ni, Zn, or Co on Cu sites etc.

Another suitable choice in $La_{2-x}Sr_xCuO_y$ systems is to use layers with optimum doping levels ($x \approx 0.15$–0.2; $y \approx 4$) as high-$T_c$ superconductor layers, and layers with a non-optimum value of x (e.g., x=0) as barrier layers. Each of this will generate one or more layers of a high-$T_c$ superconductor with a reduced critical temperature ($T_c$) and critical current density ($j_c$), and hence create an artificial Josephson junction with the critical current ($I_c$) lower than that of the native Josephson junctions with which it is in a series connection.

In this way, we can also fabricate a stack of artificial Josephson junctions, since as long as the operating current is smaller than the critical current of the native Josephson junctions, the latter will simply act as superconducting connections between the artificial Josephson junctions, and thus be 'invisible'. By varying the doping levels, we can control the normal-state resistance ($R_N$) of the artificial Josephson junctions, as well as their $I_c$. By varying their spacings (i.e., the number of high-$T_c$ superconductor layers with optimum $T_c$ and $J_c$), we can vary the degree of interaction and coupling between the two successive artificial Josephson junctions Finally, this modification allows us to achieve improvements with respect to three additional problems.

First, despite our technique of using the protective overlayer and removing it in ultra high vacuum, there remains a possibility that the surface exposed after the protective overlayer is removed may be slightly damaged or modified in comparison with the internal interfaces.

This could lead to a formation of a 'weak-link' Josephson junction, i.e., the very top Josephson junction in the mesa may be weaker (i.e., have lower $I_c$) than the others and hence be the first one to go normal as the current bias is increased. We can avoid this by introducing artificial Josephson junctions within each mesa with even lower $I_c$.

Figure 5B:
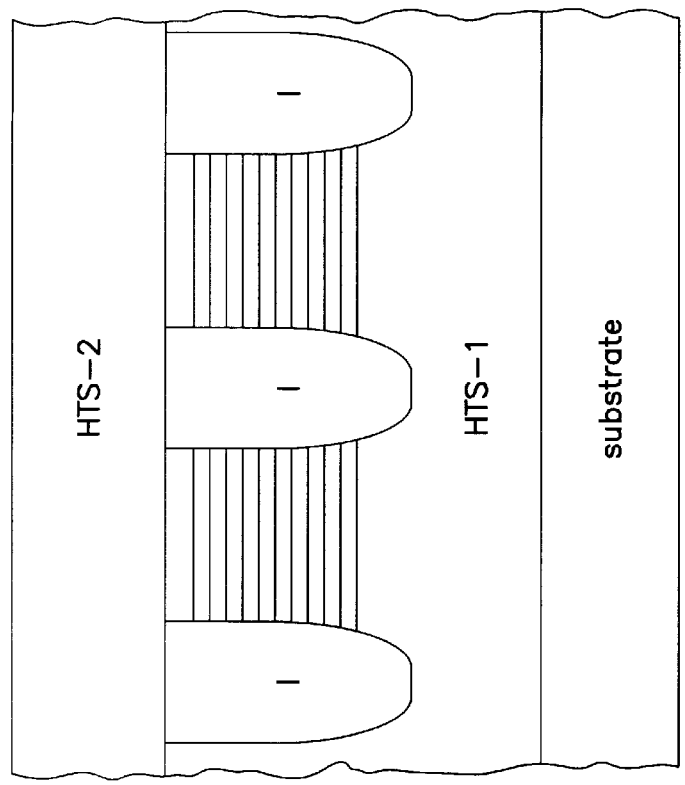
Figure 5A:
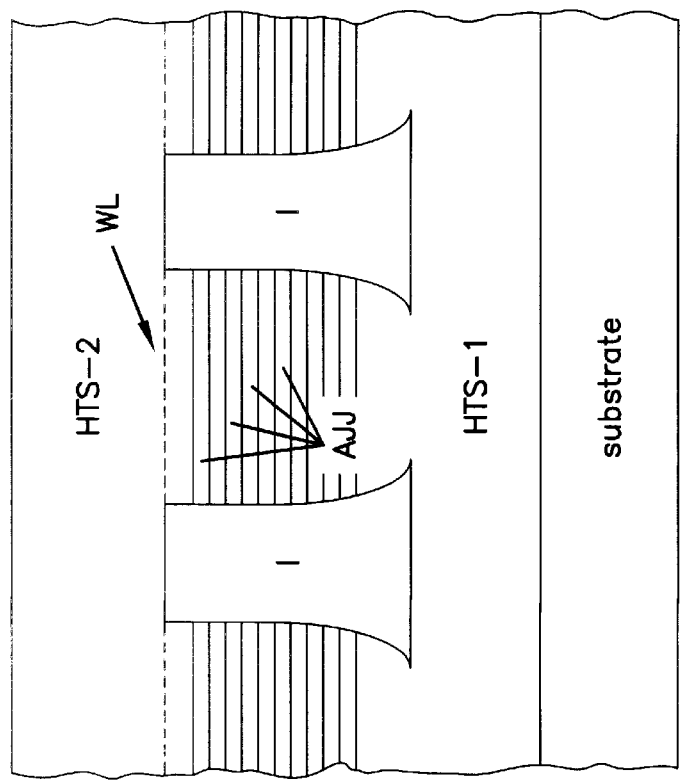
Figure 6A:
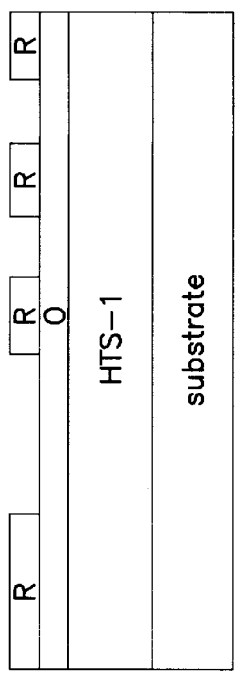
Figure 6C:
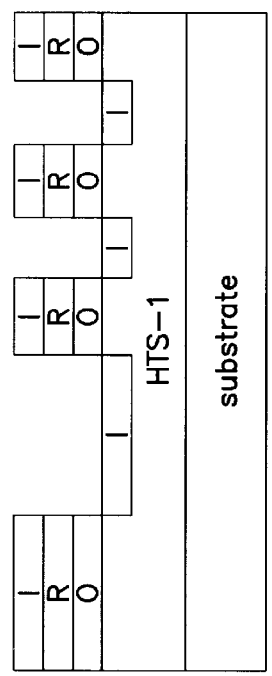
Figure 6E:
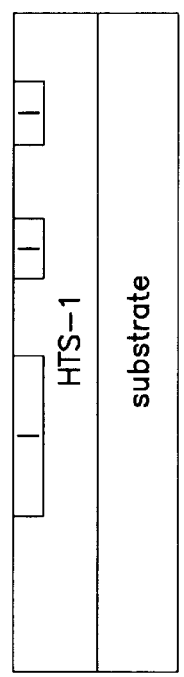
Figure 6B:
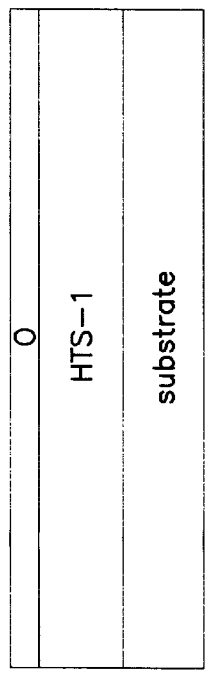
Figure 6D:
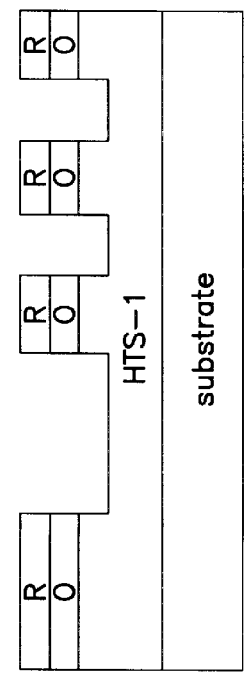
Figure 6F:
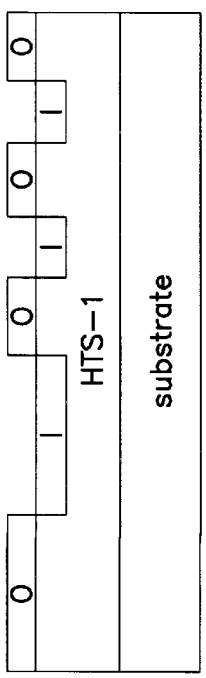
Figure 6H:
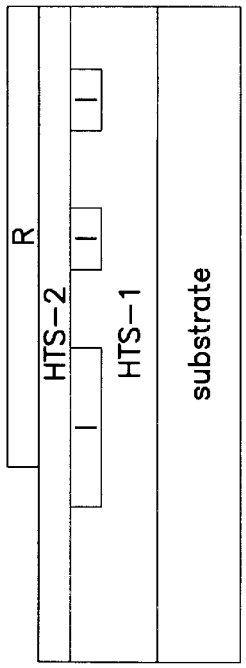
Figure 6J:
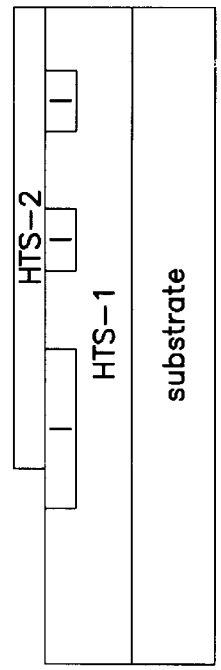
Figure 6G:
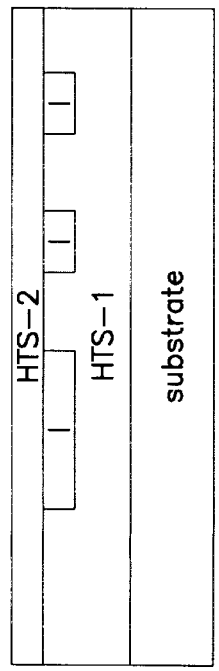
Figure 6I:
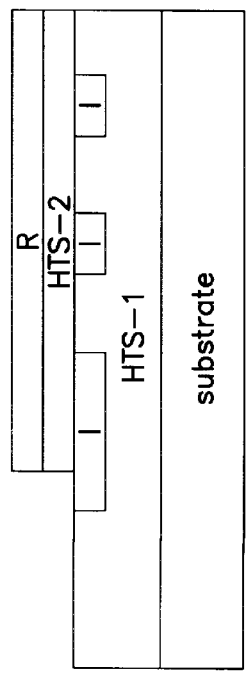
Figure 6K:
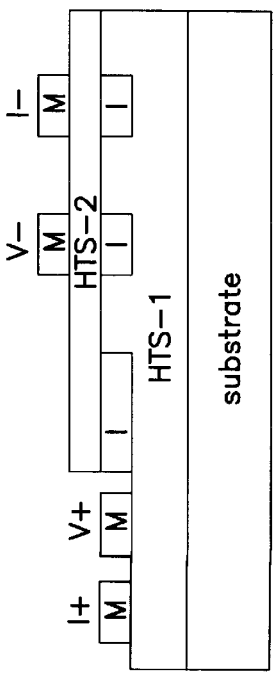
Figure 7A:
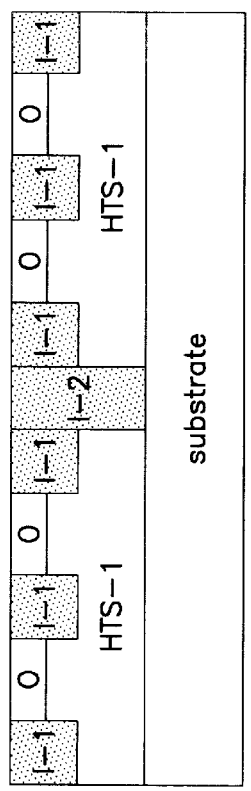
Figure 7B:
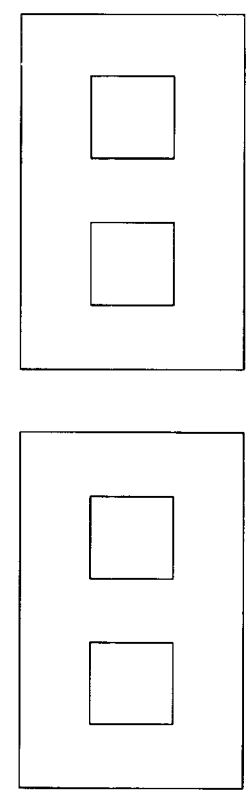
Figure 7C:
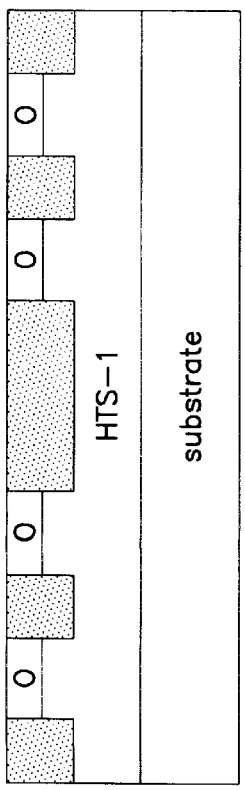
Figure 7D:
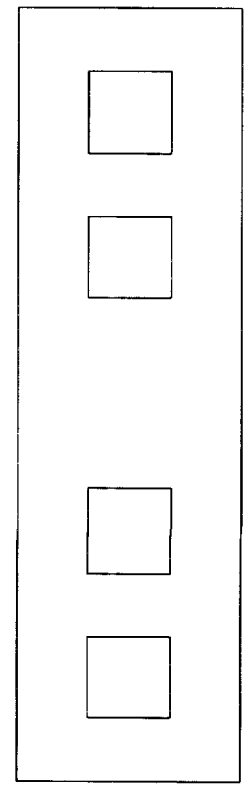
Figure 7E:
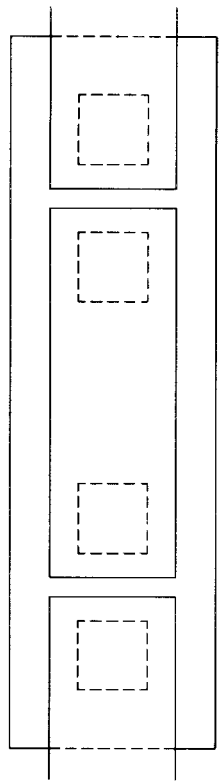
Figure 7G:
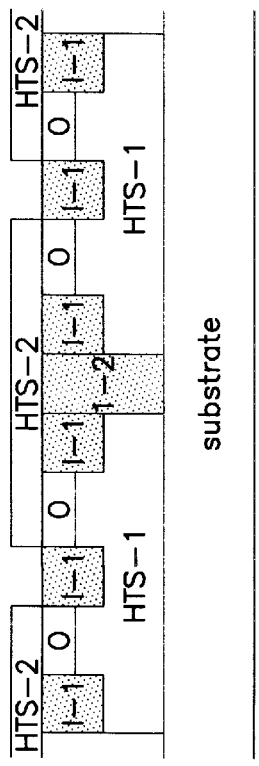
Figure 7F:
Figure 7H:
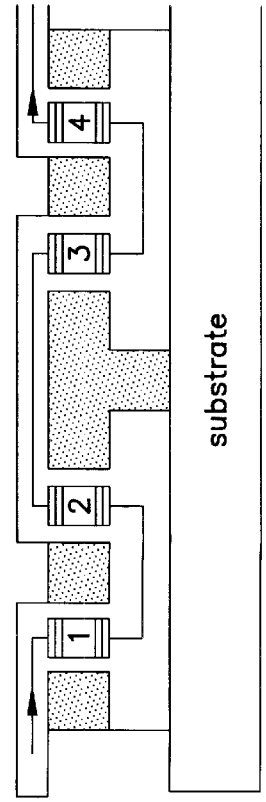

The second problem arises from the tendency of the ion milling process to produce non-uniform trenches, as shown schematically in FIG. 5a.

The same is true for other etching processes, such as wet or dry etching, etc., see FIG. 5b. In some circumstances so-called under-etching occurs, and the trench is wider at the bottom; in other cases, it may be the other way around. This indeed affects considerably the uniformity of native Josephson junction arrays, as shown schematically in FIG. 3.

Here, we can avoid this problem by appropriately placing the active, artificial Josephson junctions in the middle of the mesa only, thus avoiding non-uniformities coming from changes in the mesa width close to its base, as well as from the top contact.

Finally, by increasing $R_N$ of the artificial Josephson junctions in comparison with the native Josephson junctions, we can optimize the dimensions (i.e., cross-section area of the mesas) so that they are technologically accessible, (e.g. ~1–5 µm wide), by using standard photo-lithographic techniques.

(v) Connecting mesas into clusters: Parallel connections.

In order to optimize the circuit parameters (for example, to achieve impedance matching with vacuum and minimize the reflectance of the electromagnetic radiation at the device/vacuum interface), it is desirable to have the capability of electrically connecting the mesa structures, as described in section (iv) above, in any desired way. The connections should be superconducting and they should not introduce any weak links that may act as a weaker Josephson junction in series with the mesa Josephson junction arrays; in other words, one has to obtain common high-$T_c$ superconductor electrodes.

Both series and parallel connections as needed, in general. In this subsection, we describe several practical methods of achieving such superconducting connections.

The method of fabricating a parallel high-$T_c$ superconductor connection between two or more mesas follows directly from our method of fabricating the top high-$T_c$ superconductor electrode, described in section (iii) above.

It is illustrated in FIG. 6.

As explained in this figure, and following the method described in section (ii) above, the recipe essentially relies on the ability to control the etching rate and depth, in order to preserve the bottom electrode integrity. Removal of the protective overlayer in high vacuum within the growth chamber and immediate deposition of high-$T_c$ superconductor material to comprise the top electrode is also crucial. This guarantees continuity between HTS-1 and HTS-2 layers so that no weak links at the interface occur.

Notice also that there are no difficult alignment steps in this procedure; in particular, insulation and mesa-etching are self-aligned and done in the same processing chamber as two consecutive steps without moving the wafer and using the same photoresist mask. This technique an be used without modifications to fabricate a parallel array of an arbitrary number of mesas carrying native or artificial Josephson junction arrays.

(vi) Connecting mesas into clusters: series connection.

In this subsection, we will describe a method of achieving a series connection between individual mesas, or between clusters of mesas already connected in parallel. The method is general, and it involves only one sensitive alignment step which however is not critical for junction uniformity. It is described in FIG. 7. Most process steps are similar to the ones described in section (ii) and section (v) above. In step C, the alignment is not critical; neither is the etch rate control, since all that is needed is to etch all the way through to the substrate, to isolate the two clusters.

Simple wet etching can be used in this step, e.g., by using dilute nitric acid, $HNO_3$. However, in step E there is a somewhat more sensitive alignment, since the trench separating the two top HTS-2 electrodes must be placed in-between the two mesas.

Given the need to pack the mesas as close to one another as possible, one might assume that this separation may be about 1–2 µm, so this trench has to be placed there with about 1 µm accuracy.

This is well within ordinary photo-lithographiic alignment capabilities.

In FIGS. 7. G and 7. H, we have illustrated the current path and the equivalent circuit showing that we have indeed achieved series connections of mesas and Josephson junction arrays contained therein wish this method. Note that all the contacts are superconducting and there are no weak links in this structure. FIGS. 7. I and 7. J illustrate the possibility to fabricate more complex networks which combine both parallel and series connections thus allowing for substantial flexibility in optimizing the circuit parameters.

(vii) Circuit optimization.

In sections (v) and (vi) above, we have shown how to fabricate Josephson junction networks of complex topologies, involving both series and parallel superconducting connections. This allows for a substantial flexibility in circuit design and optimization of various parameters. We will illustrate this here by considering some realistic cases.

Let us consider first a single mesa containing a linear Josephson junction array (stack) of either native or artificial Josephson junctions . The characteristic voltage in such junctions may be about 25 mV for native Josephson junctions; the maximum value reported for artificial Josephson junctions is $I_cR$=10 mV, where R is the normal-state resistance of a single junction. The maximum allowable critical current for a single junction is about $I_c$=1 mA; above this value one in general observes distorted I-V characteristics due to flux flow. (In other words, the junction behaves like a "long junction" with currents flowing both forward and backward at different places within the junctions). From $I_cR$=10 mV and $I_c$=1 mA, we get R=10 Ω as a typical lower limit for the resistance of a single junction. Load-matching the device to vacuum (since we want to extract maximum power out of the Josephson junction array, we have to minimize the reflectance of microwave radiation at the device/vacuum interface) dictates that $R_{TOT}$=NR≈300 Ω, so for R=10 Ω we get N=30. If $I_c$ were smaller than 1 mA, we would have gotten an even larger value for R, and hence a smaller value for N, so this may be an upper limit for a single, load-matched linear Josephson junction array.

Actually, one could get a smaller R and hence a larger N while not exceeding the $I_c \leq 1$ mA limit, at the expense of having a smaller $I_cR$ product, which can be easily achieved, but this actually does not increase the output power. This can be seen by recasting the power in the form $P_{MAX}^{out}=\frac{1}{8}I_c^2 R_{TOT}$, where both $R_{TOT}$ and $I_c$ are constrained ($I_c^{MAX}=1$ mA, $R_{TOT}=300\Omega$) and do not depend on N.

Dimensions of the junctions are also constrained by these values. If $j_c^\perp=10^4$A/cm$^2$, from $I_c=1$ mA we get that the junction area is equal to $A=I_c/j_c=10^{-3}A/10^4A/m^2=10^{-7}$cm$^2=10$ $\mu$m$^2$.

Hence, one needs square cross-section Josephson junctions with about a $=3$ $\mu$m on the side, or circular cross-section Josephson junctions with about 3.5 $\mu$m diameter. These values correspond to native Josephson junctions in very anisotropic high-$T_c$ superconductor materials such as $Bi_2Sr_2CaCu_2O_8$.

For less anisotropic high-$T_c$ superconductor compounds, $j_c^\perp$ may be higher (up to $10^6$A/cm$^2$ in $YBa_2Cu_3O_7$), and hence one would need even smaller junctions. On the other hand, if artificial junctions are created by doping (as expounded in section (ii) above), $j_c^\perp$ can be significantly smaller, and hence larger Josephson junctions may be used.

However, the power output of such a simple linear Josephson junction stack will be modest:

$$P_{MAX}^{out}=\frac{1}{8}NI_c^2R=(\frac{1}{8})\times 30\times 10^6\times 10A^2\Omega=5\times 10^{-4} \text{ mW}.$$

Higher power output can be achieved in more complex arrays that combine parallel and series connections. Essentially, the idea is to increase the total current while not exceeding the $I_c^{MAX}=1$ mA limit for a single junction, by using several parallel linear arrays. Of course this would decrease the total resistance, which can be brought back by increasing the number of Josephson junctions in each linear strand.

So, for a parallel connection of M strands each of which consists of N Josephson junctions connected in series one has $R_{TOT}=(N/M)R$; for $R_{TOT}=300$ $\Omega$ and $R=10$ $\Omega$, one gets $N/M=30$ or $N=30$ M.

The total current is equal to $I=MI_c$, so that the total power is $P_{TOT}^{out}=(\frac{1}{8})(MI_c)^2R_{TOT}$.

Given that $R_{TOT}=300$ $\Omega$ and $I_c=1$ mA, one gets $P_{TOT}^{out}=(\frac{1}{8})\times 10^{-6}300\times M^2 A^2\Omega\approx 0.4\times M^2$ mW.

One can see that the total output power scales with $M^2$, and it seems as if it could be increase indefinitely. However, some further constraints are imposed here by the maximum acceptable dimensions of individual Josephson junctions and the entire cluster Josephson junction array.

Namely, for a lumped Josephson junction array, phase locking can be achieved over a distance approximately $\lambda/4$, where $\lambda$ is the wavelength of the emitted electromagnetic radiation. If the desired maximum operating frequency is $\nu=3$ THz, then $\lambda=100$ $\mu$m; for $\lambda=1$ THz, one has $\lambda=300$ $\mu$m.

Hence, the total area occupied by a two-dimensional cluster with parallel connection of M mesas can be about $25\times 25$ $\mu$m$^2$ for 3 THz operation and up to $75\times 75$ $\mu$m$^2$ for 1 THz operation If one mesa occupies the area of $3\times 3$ $\mu$m$^2$, one gets M between $5\times 5=25$ (for 3 THz operation) and $20\times 20=400$ (for 1 THz operation). Allowing for some separation (2 $\mu$m) between the junctions with these values for h one would predict quite respectable power levels, sufficient for many applications: $P\approx 10$ mW at 3 THz, $P\approx 160$ mW at 1 THz (!).

However, it would be very difficult to achieve these values with thin film technology, because of the load-matching constraint. Namely, we have already established the requirement that because $R_{TOT}=300$ $\Omega$ and $R=10$ $\Omega$, one has $N=30$ M.

Thus for $M=25$ one gets $N=750$ and for $M=400$ one gets $N=12,000$. These numbers are too large for a single mesa in a thin film, even when native Josephson junctions are used in high-$T_c$ superconductor compounds. The typical c-axis periodicity is about 10–20 Å, so we get the mesa height of about 7.500Å=0.75 $\mu$m for the 3 THz device and about 15–30 $\mu$m for the 1 THz limiting device. These mesa heights are unrealistically large for the present day thin film technology. Uniform mesas can be fabricated today with state-of-the-art single-crystal thin film growth (such as by MBE) with the maximum height of about 1,000 Å. This can be conceivably increased by a factor of 2 or 3 in the near future. Thus, N is limited to about 100 in thin films, and this only for native Josephson junctions. In general, artificial Josephson junctions will involve several molecular layers of the undoped high-$T_c$ superconductor plus one (or more) of doped layers, so N will be significantly smaller.

Indeed, it is possible to fabricate significantly taller mesa structures, 1–10 $\mu$m, by etching bulk single crystals of high-$T_c$ superconductor compounds. So far, however, these did not show ideal phase locking and significant power levels of emitted electromagnetic radiation.

Therefore, our optimized circuit design, within the constraints of using the thin film technology, combines series and parallel mesa connections along the lines illustrated in FIGS. 7.I and 7.H.

As an example, for 3 THz operation one can use an array of $5\times 5$ mesas, with $M=5$ (all mesas in one row connected in parallel) and $N=5\times 30=150$, where 5 mesas with 30 Josephson junctions each are connected in series. This could provide $P_{TOT}^{out}\approx 0.4M$ mW=2 mW, which still is sufficient for many applications.

For 1 THz operation we can afford a larger area with say $20\times 20$ mesas.

If pairs of neighboring rows are connected in parallel, one gets $M=40$. Load matching is achieved with 120 Josephson junctions in each mesa, and 10 mesas connected in series, i.e., $N=1,200$, so that $N/M=30$. Here $P_{TOT}^{out}=0.4\times 40$ mW=16 mW.

The above considerations were restricted to the case of a single lumped Josephson junction array. Indeed, it is possible to further increase the maximum output power of emitted electromagnetic radiation using the distributed array of such clusters, as described in [Lukens 1990, Han et al. 1992, 1994]. We can place clusters as described above equidistantly, with spacings $\lambda$ between them (say $\lambda=300$ $\mu$m for $\nu=1$ THz operation).

By covering the whole film with an insulator (such as $SiO_2$, $MgO$, $CeO_2$, etc.) and a metallic layer (e.g., gold or silver), one can fabricate a transmission line dong which the electromagnetic wave will propagate, as illustrated in FIG. 8.

Phase locking can be achieved in such structures of considerable lengths, thus increasing the output power of emission significantly (by the number of distributed clusters). However, the drawback of such a device is that its operation is restricted to the frequency where the wavelength of electromagnetic radiation is similar to the distance between two consecutive clusters. Thus one can achieve significantly higher output powers at the expense of frequency tunability.

Other aspects of chip optimization include on-chip integration of an antenna, where one can conveniently utilize the existing superconducting film (HTS-1 and HTS-2) to fabricate an antenna of a desired design.

(viii) Tunneltron microwave emission source.

Once we have fabricated a thin film chip containing one cluster of mesas (with in general both parallel and serial superconducting connections between them), and other standard microwave circuit elements such as transmission lines and antennas, it can be connected to a standard control electronics box which should include a controllable current source (up to about 100 mA), and appropriate controls and readouts for frequency and power of the emitted radiation. This comprises a complete source of narrow-band electromagnetic radiation, tunable over a broad frequency range and up to frequencies as high as 5–10 THz.

We call this apparatus of the present invention the (basic) Tunneltron It is schematically illustrated in FIG. 1.A.

(ix) Advanced Adaptable Tunneltron.

A more advanced extension of the apparatus of this invention, as described in section (viii) above, consists of a number of clusters of mesas, each of which contains a series array of naturally or artificially stacked Josephson junctions, which are connected by superconducting contacts as described in sections (v), (vi), and (vii). Here, each such cluster has separate electrical contacts for external control, and is controlled individually. This provides the user with the possibility of switching individual clusters on or off, and thus changing the effective geometrical shape of the working part of the circuit. We call this apparatus of the invention AA-Tunneltron, abbreviating for Advanced Adaptable Tunneltron.

The principle of operation of a: AA-Tunneltron is illustrated in FIG. 9. For simplicity, we have shown the example in which M=1 and N=30, with each cluster consisting of a single mesa, i.e. a single linear stacked Josephson junction array. Each column is assumed to be optimized for output power, i.e., load impedance matched to vacuum.

Each column is further assumed to be controllable electronically, separately, and from the outside, by means of a standard electronics control circuit.

Overall, this situation corresponds to the one illustrated schematically in FIG. 2.A. The individual columns will phase-lock provided they are close enough (say within about $\lambda/4$, where $\lambda$ is the wavelength of the emitted electromagnetic radiation within the medium) and uniform enough (say, the spread in $I_c$ and R values of individual Josephson junctions being no more than ±5%.)

Notice that under phase-locking condition, the output power scales as $M^2$, where M is the number of individual columns.

In FIG. 9, we show several possible configurations of a 2D array of columns (mesas) each of which is assumed to consist of a linear array of stacked artificial or native Josephson junctions. Each column is further assumed to be individually controlled (contacts are not shown), and to be optimized for emission power output.

All the Josephson junctions are assumed to be phase locked. (This indeed introduces geometrical and physical constraints, as explained in section (vii) above; for example, the lateral dimension.,; of the array are limited to about 25–100 $\mu$m insofar that THz-operation is requested). By switching off some columns while the others are emitting it is possible to change the effective geometrical shape of the array from approximately circular (FIG. 9.A) to elongated and rectangular (FIGS. 9.B and 9.C) to triangular (FIG. 9.D). This explains the idea of the AA-Tunneltron: one can electronically change the geometry of the emitted microwave beam, focus or defocus, sweep, etc.

(x) The second embodiment of the Tunneltron using bulk single crystals of highs-$T_c$ superconductor materials.

Indeed, as it will be obvious to one of average skill in the art that the processes and apparatus described in sections (ii)–(ix) above, can be also produced by fully analogous steps involving high-quality single crystals of high-$T_c$ superconductors. The same photolithographic techniques and steps, including etching and ion-milling, as well as subsequent overgrowths by another high-$T_c$ superconductor layer (HTS-2) for the top conducting electrode, can also be employed in this case. The main limiting factor here is the uniformity of the Josephson junctions in one mesa and between different mesas. Another is the limited flexibility in controlling the materials parameters such as $j_c$ or R. But within these constraints, the same ideas embodied in the present invention of the Tunneltron can also be practiced here, thus constituting just another special embodiment of the same invention.

(Xi) The third embodiment of the Tunneltron using conventional (low-temperature) superconducting materials.

Further fully analogous embodiments of the present apparatus of invention can be realized by using conventional (low-temperature) superconducting materials, for example Nb/A10$_x$Nb or NbCN/MgO/NbCN tunnel junctions. As it will be obvious to one of average skill of the art, one can use completely analogous thin-film growth techniques and photolithographic steps to produce the apparatus of this invention also with these superconducting materials. There will be in this case some additional constraints coming from less favorable materials parameters.

First, because of the lower critical temperatures ($T_c$=9.2 K in Nb and $T_c$=16 K in NbN or NbCN, etc.) the gap frequencies in these materials are also substantially lower ($v_g$=0.9 THz in Nb, and $v_g$=1.7 THz in NbN) compared to those in high-$T_c$ superconductor materials (up to $v_g$=5–10 THz). Hence, with low-temperature superconductors one is limited to lower operating, frequencies.

The second limitation comes from the superconducting coherence length being much larger in conventional (low-$T_c$) superconductors. For this reason, one must in this case use significantly thicker superconducting electrodes, including specifically the inner electrodes within one mesa or stack of Josephson junctions. For the same total film thickness, one gets much fewer Josephson junctions in a stack. In practice, it will be difficult to fabricate more than 5–10 Josephson junctions stacked vertically one on top of the other in this way.

The final restriction also comes from the lower $T_c$: in this case one requires a lower operating temperature (e.g. 4.2 K or liquid helium) which in principle requires more complex and more expensive cryo-cooler equipment.

However, within these restriction, it is possible to fabricate the apparatus of this invention (Tunneltron) also by using conventional low-$T_c$ superconductors, which is just another special embodiment of the same invention.

Applications: Electronics components, subsystems and systems based on the Tunneltron The present device of invention is useable in virtually any prior art equipment which formerly employed millimeter and sub-millimeter microwave radiation sources and detectors. Additionally, completely novel application fields are opened by use of this device.

In what follows, some examples are given:

Some lasers and backward-wave tubes (carcinotrons) operate in the sub-millimeter region, but they are bulky sources with large power consumption. Solid-state oscillators, such as GUNN-diodes or IMPATT diodes are limited to the millimeter wave range. Josephson junctions, clustered into arrays, and load-matched for optimum power output, can be voltage-controlled and can cover a broad frequency band all the way into the Terahertz frequency region.

Quantum detection of electromagnetic radiation, which is a familiar concept in the visible and near-infrared region of the spectrum, has until recently been possible in the microwave and millimeter-wave portions of the spectrum only within narrow bandwidths centered at the resonant frequencies of a few MASER amplifiers. The standard detection techniques covering this frequency region employ nonlinear resistive elements, usually Schottky barrier diodes as classical rectifiers and heterodyne mixers. Their performance is based on the conversion of power between frequencies rather than the conversion of photons to carriers, as is the case with quantum detection.

The abrupt non-linearity of the dc I-V characteristic in the single-particle tunneling of SIS tunnel barriers provides a tool for resistive mixing.

Heterodyne receivers with Josephson junctions as such mixing elements have demonstrated a sensitivity approaching the quantum limit at frequencies up to several hundred GHz. The function of a heterodyne receiver is to mix a weak incoming signal at frequency v. with a large-amplitude local oscillator frequency VLO, whereby an intermediate frequency output $v_{if}=|v_s-v_{LO}|$ is generated and used for further electronic processing. A stream of photons with an arrival rate of one photon per nanosecond is a typical value of detection power of such a device. Radio-astronomy in the millimeter and sub-millimeter wave portion of the spectrum, which is highly interesting due to the intense exploration activities of the interstellar medium, has now the potential to reach major advances in describing the structure of the universe.

Investigations of the 115 GHz rotational emission from interstellar carbon monoxide (CO) with a $\lambda$=2.6 mm wave receiver points also toward the potential which the proposed device might have in earth-bound microwave spectroscopy of organic and inorganic materials.

Spectroscopy as a generic term implies the study of the emission and absorption of electromagnetic radiation, as related to the radiation frequency of the excitation source. The Tunneltron device provides as an outstanding and new feature the possibility to be used for both the excitation of the object under study, and the detection of its response by absorption or emission.

As an example, the Tunneltron will enable monitoring of organic and inorganic compounds in vapors, liquids and solids, with respect to the chemical composition, geometric and energetic structures, as well as interaction processes, and all this as a function of various external parameters and in a time-resolved manner, thus opening a wide application field for the device of invention. Indeed, there are many other related problems where one could make use of spectrometric properties, as e.g., the detection of exposed or hidden chemical compounds (drugs, plastics, . . . ) after corresponding excitation by appropriate sub-millimeter electromagnetic radiation, quality control devices for specific materials properties (e.g., water content or impurities in solid materials).

These also contribute to a wide field of new applications of the device of this invention.

The Tunneltron as a coherent and tunable radiation source, and in particular in its embodiment as a Maser, provides wave properties of the emitted radiation field (coherence, monochromaticity), which enable its use in holography and interferometry. Holography is in principle a means of creating a unique photographic image of a coherently illuminated object, where an undisturbed beam and the beam reflected of the observed object are brought to interference on a detecting medium.

The reconstruction of this interference pattern delivers a three-dimensional picture of the object. The capability to vary the frequency of the coherent Tunneltron source, as well as the possibility of propagation through obstacles (which are opaque in the visible, but transparent for the corresponding millimeter or sub-millimeter radiation) in front of the object, opens prospects for many further applications.

Communication and data transfer (e.g., image transmission) is another field of application of the device proposed here, leveraging on its potential for covering a frequency region far beyond the frequency bands administered and coordinated presently by the ITU (Internat. Telecomm. Union). The new frequency region provides a considerably increased number of new channels for both satellite and terrestrial communication. [Consider a channel width of 20 MHz, then a frequency band 5 THz wide would contain about 250,000 channels. This compares e.g. to the 40 channels for satellite communication, 19.18 MHz wide, with the frequency band of 11.7 . . . 12.5 GHz, which was destined by the ITU for Europe, Africa and the former Soviet Union together (Region 1)]. Take a 4 kHz channel width for telephone communication; in this case one would get almost 2 billion talk channels, riding on such a high carrier frequency.

A high quality transmission requires digital systems with pulse code modulation (PCM).

Frequency modulation would increase the noise power way up the 3 pW/km (approx. 52 dB), recommended by the CCIR as an upper limit.

Digital systems allow a regeneration of signals in intermediate relay stations, avoiding accumulation of errors.

It might even be possible to build a completely wireless terrestrial microwave-relay communications network, a broad-bandwidth wireless link to the Internet and a broadbandwidth satellite communications link in the new frequency region with all advantages of the high number of telephone channels, with the additional benefit of the reduced load of dangerous radiation by virtue of the smaller absorption depth of human skin for sub-millimeter radiation.

Multifrequency Imaging Microwave Radiometers (MIMR) for distant satellite or airborn inspection of the underlying air space or the earth's surface has a high potential for practical use. Future remote-sensing satellites, instead of carrying multispectral instruments covering up to seven spectral bands as they do now, will have hyperspectral instruments gathering imagery in many more spectral bands. Relatively closed-up panoramic observation out of flying helicopters as well as from airplanes approaching the airport and landing, will have an impact on maneuverability and general security. The same may be true for street-based traffic (automotive electronics), and even for robotics applications under corresponding environmental conditions. A basic requirement is a powerful, high-frequency, tunable, nearly monochromatic, and very fast sub-millimeter source and detector. Such a device is provided by the present invention. The device of the present invention, which may be an on-chip integrated emitter and detector of millimeter and sub-millimeter radiation, is also suitable for Radar applications in the most general sense: radio-location systems, radio-navigation systems, radio-electronic reconnaissance and radio-electronic countermeasures.

There is a growing need for compact low-power radar for both civilian and military applications.

Since it can be used to determine the velocity of a moving object, automatic collision-avoiding systems in automobiles may be improved; the same is true also for intrusion alarms and traffic monitors.

The Tunneltron may also act as an active sensor in synthetic aperture radar (SAR) applications. A SAR systems beams microwave radiation towards the object (the Earth when remote sensing from satellites is considered) and detects the returned echoes. The fine tuning of the emitter allows to position the frequencies within the absorption minima of the atmosphere. The electronic scanning capability of the advanced Tunneltron delivers an additional advantage here.

Biological and medical applications of the device of invention are also manifold and straight forward.

What is claimed is:

1. A Josephson junction array device, comprised of a substrate, a superconducting thin film, deposited on that substrate and containing a sequence of layers typical in a series array of vertically stacked Josephson junctions, comprising:

a superconducting mesa structure or structures on top of, or fabricated out of said superconducting thin film, electrical bottom and top contacts and means for applying an electrical voltage or current to the electrodes, characterized in that the mesas are monolithically integrated between superconducting electrical end contacts on either side, and that means are provided for any partial number of those superconducting mesas being combined in groups for interconnection and control purposes;

a linear or two-dimensional lateral array of at least 2 to several thousand columns in parallel connection, each of said columns containing 2 to 2000 vertically stacked Josephson junctions, between common superconducting base and top contacts, with means for connecting to a controllable current source such that the Josephson junctions are driven into the ac (emitting) regime;

wherein the top contact is split in three or more segments with means for connecting to a controllable current source such that a series connection of three or more segments with parallel connected columns is achieved; and wherein a distributed array of series connected Tunneltron segments is formed, placed at wavelength intervals along a serpentine microstrip transmission line for higher power output.

2. A Josephson junction array device according to claim 1, accomplished in epitaxially grown c-axis oriented high-$T_c$ superconductor films containing intrinsic Josephson junction stacks.

3. A Josephson junction array device according to claim 1, with artificially fabricated Josephson junction stacks, achieved by inserting barrier layers between high-$T_c$ superconductor layers that serve as superconducting electrodes.

4. A Josephson junction array device according to claim 1, where barrier layers are created by site-selective doping which reduces the critical temperature of high-$T_c$ superconductor materials.

5. A Josephson junction array device according to claim 1, where the contact means provide for voltage measurements in the detector regime.

6. A Josephson junction array device according to claim 1, comprising superconducting top contacts split into two segments, with means for connecting to a controllable current source such that a series connection between the two segments, each containing multiple parallel connected columns, is achieved.

7. A Josephson junction array device according to claim 1, where any available segment is accessible independently by external means in order to affect or suppress the ac (emitting) regime of certain segments.

8. A Josephson junction array device according to claim 1, where any available segment is accessible independently by external means in order to establish an integrated detector mode of certain segments in parallel with the ac (emitting) regime of other segments.

* * * * *